(12) United States Patent
Wei et al.

(10) Patent No.: US 11,444,038 B2
(45) Date of Patent: Sep. 13, 2022

(54) FORMING LARGE CHIPS THROUGH STITCHING

(71) Applicant: Taiwan Semiconductor Manufacturing Company, Ltd., Hsinchu (TW)

(72) Inventors: Wen Hsin Wei, Hsinchu (TW); Hsien-Pin Hu, Zhubei (TW); Shang-Yun Hou, Jubei (TW); Weiming Chris Chen, Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 124 days.

(21) Appl. No.: 16/704,303

(22) Filed: Dec. 5, 2019

(65) Prior Publication Data

US 2020/0111755 A1    Apr. 9, 2020

Related U.S. Application Data

(60) Continuation of application No. 15/681,513, filed on Aug. 21, 2017, now Pat. No. 10,515,906, which is a
(Continued)

(51) Int. Cl.
*H01L 23/00* (2006.01)
*H01L 21/768* (2006.01)
(Continued)

(52) U.S. Cl.
CPC ...... *H01L 23/564* (2013.01); *H01L 21/76808* (2013.01); *H01L 21/76816* (2013.01);
(Continued)

(58) Field of Classification Search
None
See application file for complete search history.

(56) References Cited

U.S. PATENT DOCUMENTS

| 5,702,868 | A | 12/1997 | Kellam et al. |
| 6,150,840 | A | 11/2000 | Patel et al. |

(Continued)

FOREIGN PATENT DOCUMENTS

| CN | 1495855 A | 5/2004 |
| CN | 100417997 C | 9/2008 |

(Continued)

*Primary Examiner* — Long Pham
(74) *Attorney, Agent, or Firm* — Slater Matsil, LLP

(57) ABSTRACT

A method includes performing a first light-exposure and a second a second light-exposure on a photo resist. The first light-exposure is performed using a first lithograph mask, which covers a first portion of the photo resist. The first portion of the photo resist has a first strip portion exposed in the first light-exposure. The second light-exposure is performed using a second lithograph mask, which covers a second portion of the photo resist. The second portion of the photo resist has a second strip portion exposed in the second light-exposure. The first strip portion and the second strip portion have an overlapping portion that is double exposed. The method further includes developing the photo resist to remove the first strip portion and the second strip portion, etching a dielectric layer underlying the photo resist to form a trench, and filling the trench with a conductive feature.

20 Claims, 27 Drawing Sheets

Related U.S. Application Data division of application No. 15/006,838, filed on Jan. 26, 2016, now Pat. No. 9,741,669.

(51) Int. Cl.
  *H01L 23/58* (2006.01)
  *H01L 23/31* (2006.01)
  *H01L 25/00* (2006.01)
  *H01L 23/532* (2006.01)
  *H01L 25/065* (2006.01)

(52) U.S. Cl.
  CPC .......... *H01L 23/585* (2013.01); *H01L 24/00* (2013.01); *H01L 24/94* (2013.01); *H01L 24/97* (2013.01); *H01L 23/3128* (2013.01); *H01L 23/5329* (2013.01); *H01L 23/53238* (2013.01); *H01L 24/16* (2013.01); *H01L 24/17* (2013.01); *H01L 25/0652* (2013.01); *H01L 25/0657* (2013.01); *H01L 25/50* (2013.01); *H01L 2224/14051* (2013.01); *H01L 2224/14181* (2013.01); *H01L 2224/16145* (2013.01); *H01L 2224/16227* (2013.01); *H01L 2224/17181* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2924/15311* (2013.01); *H01L 2924/181* (2013.01)

(56) References Cited

U.S. PATENT DOCUMENTS

| | | | |
|---|---|---|---|
| 7,494,766 B2 | 2/2009 | Moon et al. | |
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,084 B2 | 5/2012 | Itano et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |
| 8,729,705 B2 | 5/2014 | Wang | |
| 8,802,504 B1 | 8/2014 | Hou et al. | |
| 8,803,292 B2 | 8/2014 | Chen et al. | |
| 8,803,316 B2 | 8/2014 | Lin et al. | |
| 2004/0150070 A1* | 8/2004 | Okada | H01L 23/585 257/508 |
| 2008/0251923 A1* | 10/2008 | Wang | H01L 23/585 257/758 |
| 2008/0283959 A1 | 11/2008 | Chen et al. | |
| 2009/0160061 A1 | 6/2009 | Hsu et al. | |
| 2009/0321890 A1* | 12/2009 | Jeng | H01L 23/562 257/620 |
| 2011/0108945 A1* | 5/2011 | Wang | H01L 23/585 257/508 |
| 2012/0314379 A1 | 12/2012 | Zen | |
| 2014/0001645 A1 | 1/2014 | Lin et al. | |
| 2014/0225258 A1 | 8/2014 | Chiu et al. | |
| 2014/0252572 A1 | 9/2014 | Hou et al. | |
| 2017/0077060 A1* | 3/2017 | Hayashi | H01L 22/20 |

FOREIGN PATENT DOCUMENTS

| | | |
|---|---|---|
| CN | 101286483 A | 10/2008 |
| CN | 103412468 A | 11/2013 |

* cited by examiner

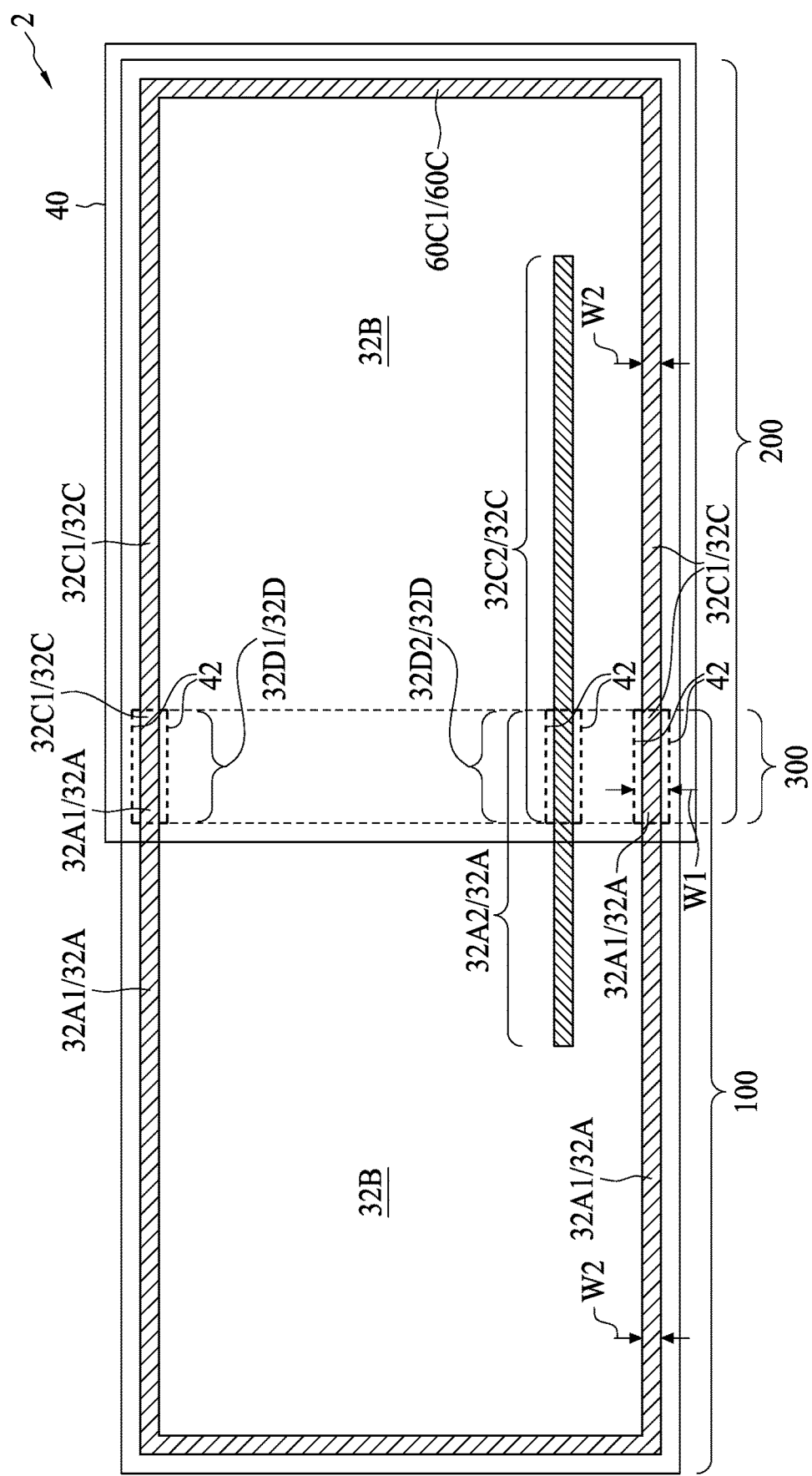

FORMING LARGE CHIPS THROUGH STITCHING

PRIORITY CLAIM AND CROSS-REFERENCE

This application is a continuation of U.S. patent application Ser. No. 15/681,513, entitled "Forming Large Chips Through Stitching," filed on Aug. 21, 2017, which is a divisional of U.S. patent application Ser. No. 15/006,838, entitled "Forming Large Chips Through Stitching," filed on Jan. 26, 2016, now U.S. Pat. No. 9,741,669 issued Aug. 22, 2017, which applications are incorporated herein by reference.

BACKGROUND

In the packaging of integrated circuits, a plurality of device dies may be bonded on an interposer wafer, which includes a plurality of interposers therein. After the bonding of the device dies, an underfill is dispensed into the gaps between the device dies and the interposer wafer. A curing process may then be performed to cure the underfill. A molding compound can be applied to encapsulate the device dies therein. The resulting interposer wafer and the top dies thereon are then sawed apart into a plurality of packages, with the packages including exposed electrical connectors such as solder balls. The packages are then bonded to package substrates or printed circuit boards.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
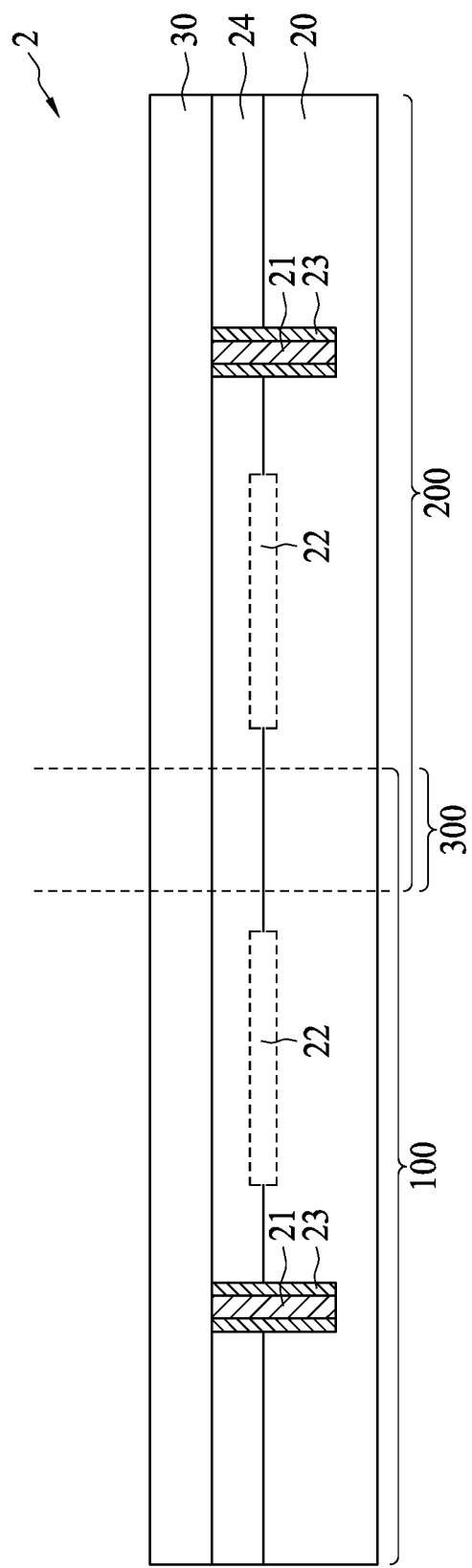
FIGS. 1 through 19 illustrate the cross-sectional views and top views of intermediate stages in the formation of a chip through stitching in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A large chip in a wafer and the method of forming the same through stitching are provided in accordance with various exemplary embodiments. The intermediate stages of forming the chip are illustrated. Some variations of some embodiments are discussed. Throughout the various views and illustrative embodiments, like reference numbers are used to designate like elements.

FIGS. 1 through 19 illustrate the cross-sectional views and top views of intermediate stages in the formation of a large chip in accordance with some embodiments. The steps shown in FIGS. 1 through 19 are also illustrated schematically in the process flow shown in FIG. 22. In the subsequent discussion, the process steps shown in FIGS. 1 through 19 are discussed referring to the process steps in FIG. 22.

FIG. 1 illustrates a cross-sectional view of wafer 2. In accordance with some embodiments of the present disclosure, wafer 2 is a device wafer including integrated circuit devices 22, which are formed on the top surface of semiconductor substrate 20. Exemplary integrated circuit devices 22 include Complementary Metal-Oxide Semiconductor (CMOS) transistors, resistors, capacitors, diodes, and/or the like. The details of integrated circuit devices 22 are not illustrated herein. In accordance with alternative embodiments of the present disclosure, wafer 2 is an interposer wafer, which does not include active devices such as transistors and diodes, and may or may not include passive devices. The interposer wafer includes a plurality of interposers, which include conductive features (such as metal pads) on the opposite sides of the interposers. Conductive traces and vias are formed in the interposers to electrically interconnect the conductive features on opposite sides of the interposers.

In accordance with some embodiments of the present disclosure, the exemplary wafer 2 includes substrate 20. Substrate 20 may be a semiconductor substrate or a dielectric substrate. When being a semiconductor substrate, substrate 20 may be formed of crystalline silicon, crystalline germanium, silicon germanium, and/or a III-V compound semiconductor such as GaAsP, AlInAs, AlGaAs, GaInAs, GaInP, GaInAsP, or the like. Semiconductor substrate 20 may also be a bulk silicon substrate or a Silicon-On-Insulator (SOI) substrate. Shallow Trench Isolation (STI) regions (not shown) may be formed in semiconductor substrate 20 to isolate the active regions in semiconductor substrate 20. When being a dielectric substrate, substrate 20 may be formed of silicon oxide, silicon carbide, silicon nitride, or the like. Through-vias 21 may be formed to extend into semiconductor substrate 20, wherein through-vias 21 are used to electrically inter-couple the features on opposite sides of wafer 2. Through-vias 21 may be insulated from substrate 20 by isolation layers 23.

Figure 19:
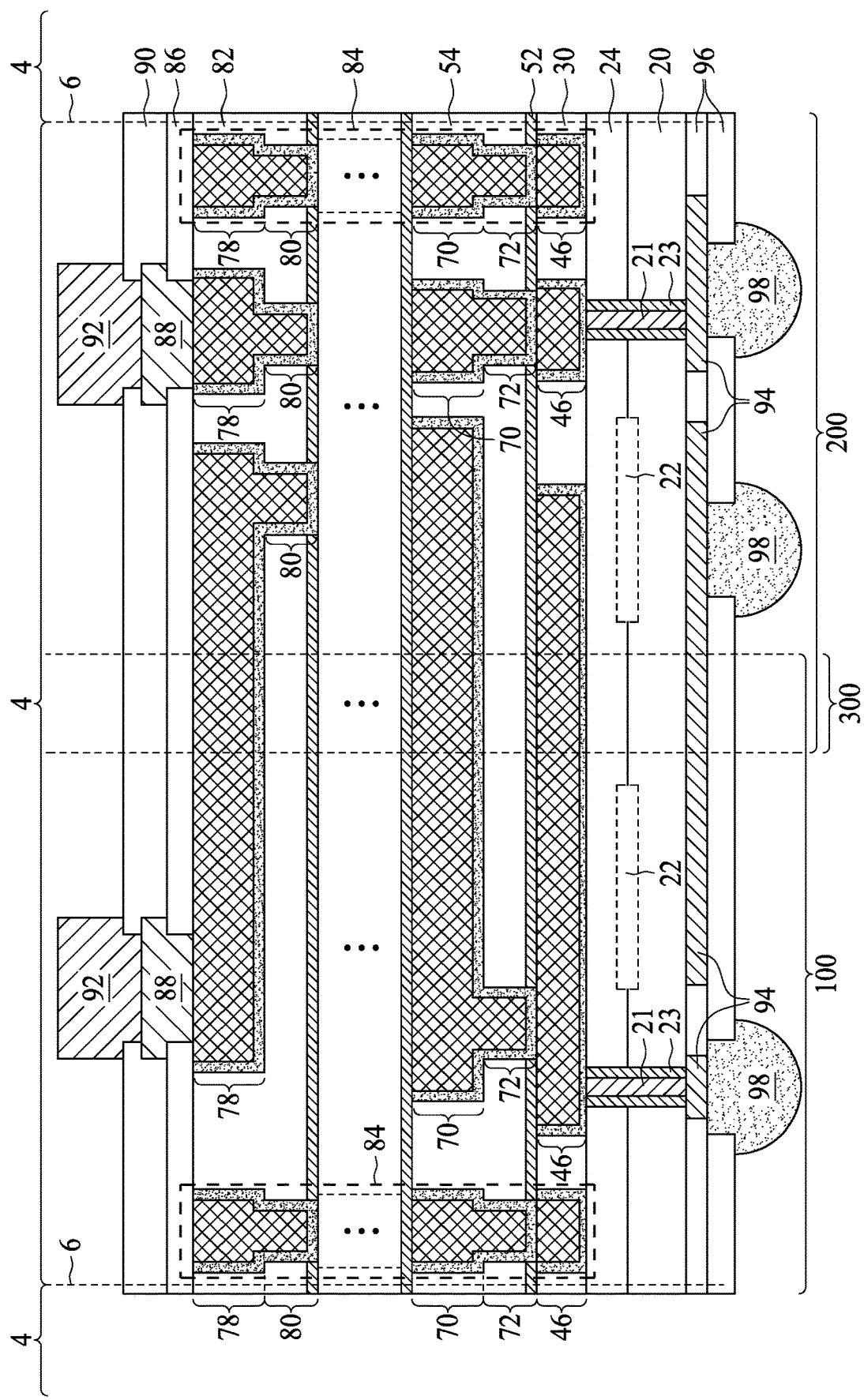

Wafer 2 includes region 100 and region 200, which are alternatively referred to as a first reticle field region and a second reticle field region, respectively. Regions 100 and 200 have an overlapping region 300, which is also referred to as a stitching zone since metal features that extend from region 100 to region 200 are stitched in region 300. Stitching zone 300 is a strip, which may have a uniform width. Furthermore, regions 100 and 200 may have substantially the same size, although their sizes may be different from each other. Wafer 2 may include a plurality of pairs of regions identical to the pair of regions 100 and 200, wherein the plurality of pairs of regions may form an array. Each pair of regions 100 and 200 is used to form a large chip, as shown in FIG. 19.

Inter-Layer Dielectric (ILD) 24 is formed over semiconductor substrate 20 and fills the space between the gate stacks of transistors (not shown) in integrated circuit devices 22 (if any). In accordance with some exemplary embodiments, ILD 24 comprises phosphosilicate glass (PSG), borosilicate glass (BSG), boron-doped phosphosilicate glass (BPSG), fluorine-doped silicate glass (FSG), tetraethyl orthosilicate (TEOS), or the like. ILD 24 may be formed using spin coating, Flowable Chemical Vapor Deposition (FCVD), or the like. In accordance with some embodiments of the present disclosure, ILD 24 is formed using a deposition method such as Plasma Enhanced Chemical Vapor Deposition (PECVD), Low Pressure Chemical Vapor Deposition (LPCVD), or the like. Through-vias 21 may also extend into ILD 24 in accordance with some embodiments.

An etch stop layer (not shown) may be formed over and in contact with ILD 24 and integrated circuit devices 22, if any. The etch stop layer may be formed of silicon carbide, silicon nitride, silicon oxynitride, silicon carbo-nitride, or the like. The etch stop layer is formed of a material that has a high etching selectivity relative to the overlying dielectric layer 30, and hence the etch stop layer may be used to stop the etching of dielectric layer 30.

In accordance with some embodiments in which wafer 2 is an interposer wafer, integrated circuit devices 22 and ILD 24 may not be formed.

Further illustrated in FIG. 1 is dielectric layer 30, which is alternatively referred to as Inter-Metal Dielectric (IMD) layer 30 hereinafter. In accordance with some embodiments of the present disclosure, IMD layer 30 is formed of a low-k dielectric material having a dielectric constant (k-value) lower than about 3.0, lower than about 2.5, or even lower. IMD layer 30 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, the formation of IMD layer 30 includes depositing a porogen-containing dielectric material, and then performing a curing process to drive out the porogen, and hence the remaining IMD layer 30 becomes porous.

In accordance with alternative embodiments, IMD layer 30 is formed of a non-low-k dielectric material such as silicon oxide, silicon nitride, silicon carbide, silicon oxynitride, or the like.

Figure 2A:
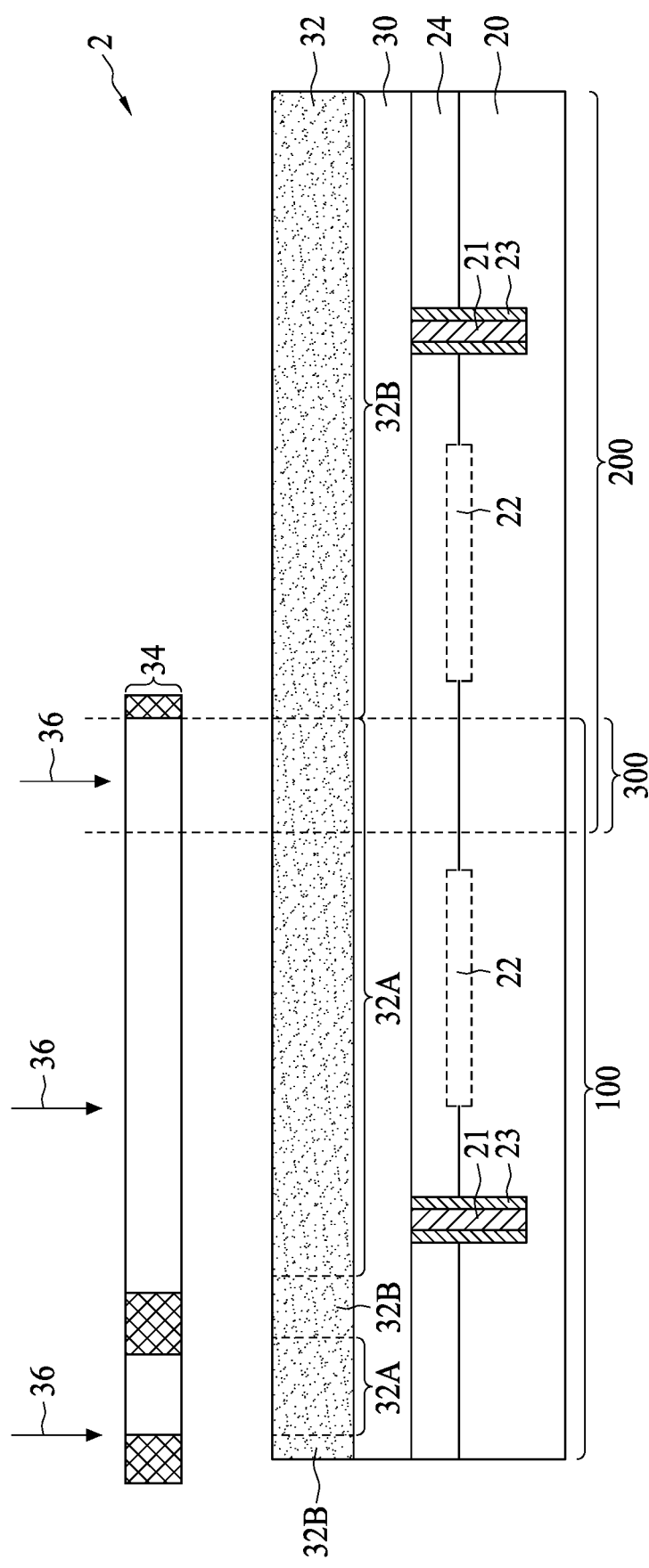

FIGS. 2A through 4 illustrates a single damascene process. Referring to FIG. 2A, photo resist 32 is applied over IMD layer 30. The respective step is shown as step 402 in the process flow illustrated in FIG. 22. Lithography mask 34 is then placed directly over region 100 including stitching zone 300. Lithography mask 34, limited by the maximum size of the reticle field, is not large enough to cover regions 100 and 200 (including 300). Rather, lithography mask 34 is used to expose the portions of photo resist 32 in region 100, but not region 200. A light-exposure is then performed to expose portions 32A of photo resist 32, and portions 32B are not exposed. The respective step is shown as step 404 in the process flow illustrated in FIG. 22.

Figure 2B:
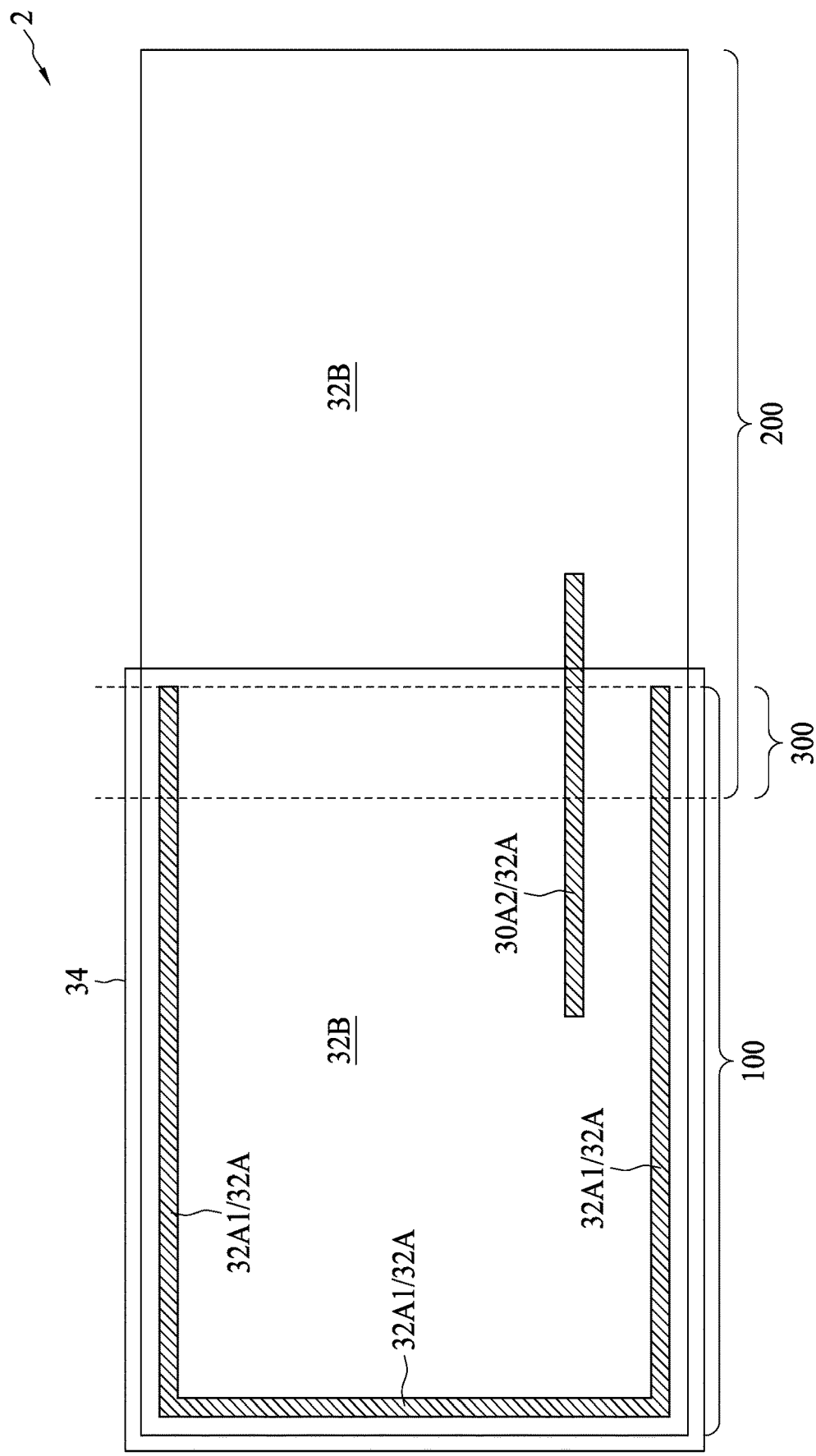

FIG. 2B illustrates a schematic top view of photo resist 32 after the light-exposure as shown in FIG. 2A. Some exemplary exposed regions 32A are illustrated schematically, wherein the exposed regions are in region 100. The exposed portions 32A further include portions 32A1 and portions 32A2, wherein portion 32A1 is proximal to the edges of the resulting chip/die 4 (FIG. 19), and define the patterns for forming seal ring 84. Portion 32A2 represents the portions that are used for forming metal lines in subsequent steps.

Figure 3A:
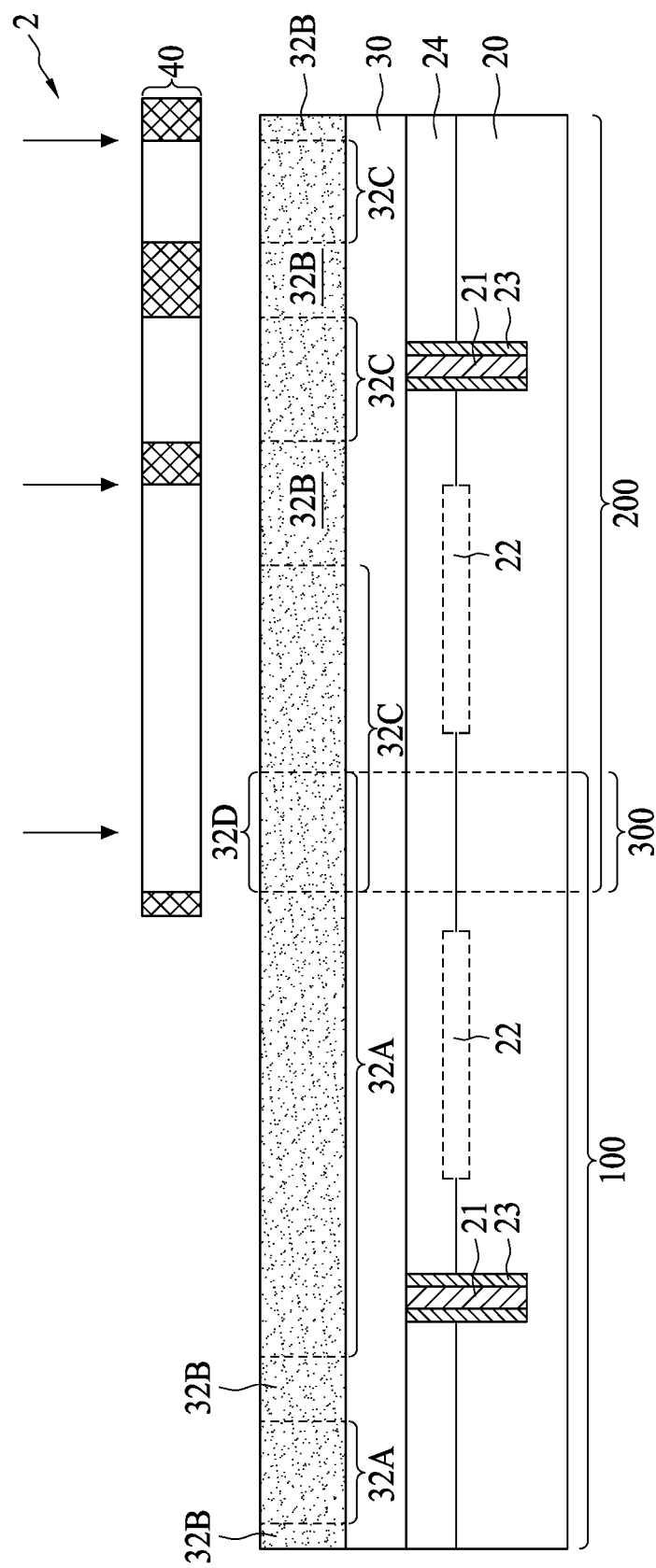

Referring to FIG. 3A, lithography mask 40 is placed directly over region 200 (including stitching zone 300). Lithography mask 40, limited by the maximum size of the reticle field, is not large enough to cover both regions 100 and 200, and is used to expose the portions of photo resist 32 in region 200, but not region 100. A light-exposure is then performed to expose portions 32C of photo resist 32, and portions 32B remain not exposed. The respective step is shown as step 406 in the process flow illustrated in FIG. 22. Some of the exposed portions 32C overlap parts of the exposed portions 32A that have been exposed in the step shown in FIG. 2A. The overlap portions of portions 32A and 32C are referred to as double exposed portions 32D hereinafter. Double exposed portions 32D are in stitching zone 300.

FIG. 3B illustrates a schematic top view of photo resist 32 after the light-exposure as shown in FIG. 3A. Some exemplary exposed regions 32C are illustrated schematically, wherein the exposed regions are in region 200 and stitching zone 300. The exposed portions 32C further include portions 32C1 and portions 32C2, wherein portions 32C1 are proximal to the edges of the resulting chip 4 (FIG. 19) and define the patterns for forming seal ring 84. Portion 32C2 represents the portions that are used for forming metal lines in subsequent steps. Double exposed portions 32D also include portions 32D1 and 32D2. Through the two light-exposures using different lithography masks, features 32A, 32B, and 32C in combination may expand beyond the area of a single reticle field. The joining of the patterns in regions 100 and 200 is referred to as stitching.

Double exposed portions 32D are light-exposed twice. Accordingly, the widths W1 of double exposed portions 32D may be greater than the width W2 of portions 32A and 32C. For example, dashed lines 42 schematically illustrate that double exposed portions 32D, which are wider than the portions exposed once. In addition, if one or both lithography masks 34 (FIG. 2A) and 40 (FIG. 3A) are not aligned accurately, portions 32A2 and 32C2 may not be aligned to a straight line, and may be shifted (but parallel with each other) or slanted (joined and not parallel), even if portions 32A2 and 32C2 are defined in the lithography masks as being a continuous straight strip having a uniform width. Similarly, portions 32A1 and 32C1 may not be aligned to a straight line.

Figure 4:
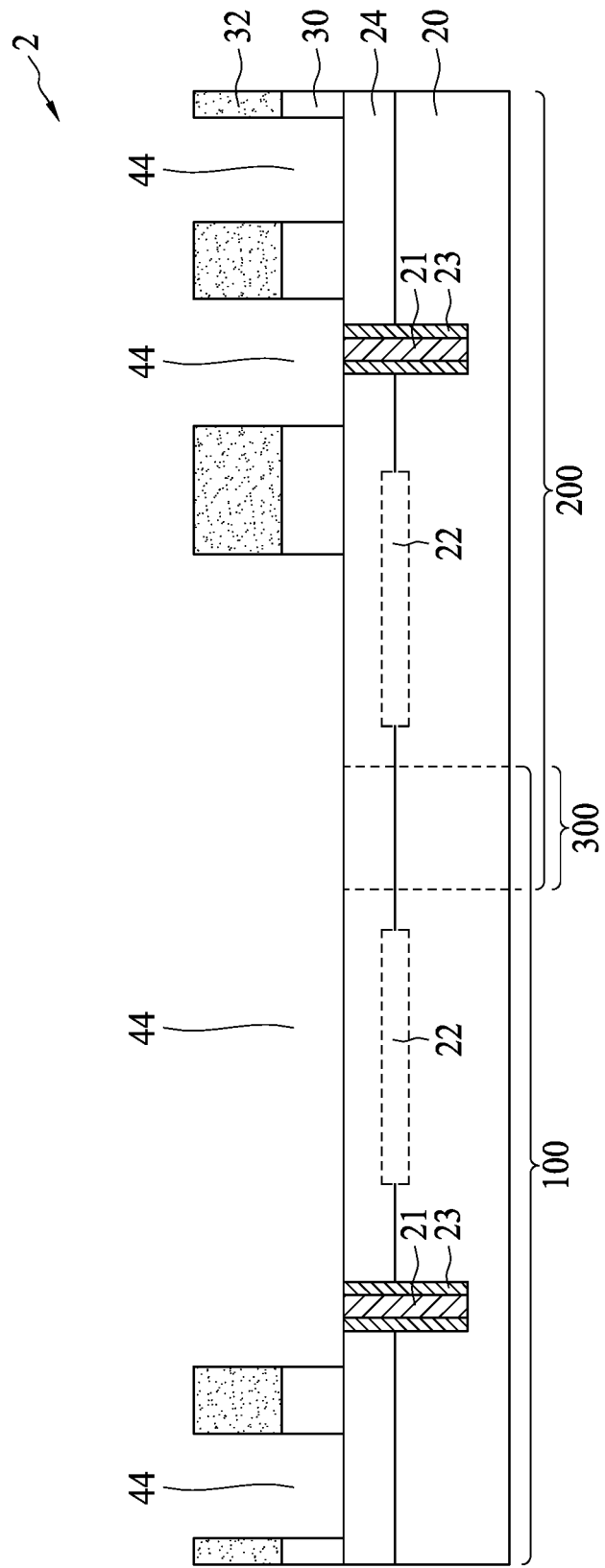

Next, a photo resist development is performed, and the exposed portions 32A and 32C (including the double exposed regions 32D) are removed, and unexposed portions 32B remain. The respective step is shown as step 408 in the process flow illustrated in FIG. 22. The resulting structure is shown in FIG. 4. Photo resist 32 is then used as an etching mask to etch the underlying IMD layer 30, resulting in trenches 44 in IMD layer. 30. The respective step is shown as step 410 in the process flow illustrated in FIG. 22. If there is an etch stop layer over ILD layer 24, the etch stop layer is also etched through. Through-vias 21 are exposed to trenches 44 in accordance with some embodiments. Photo resist 32 is then removed.

Figure 5:
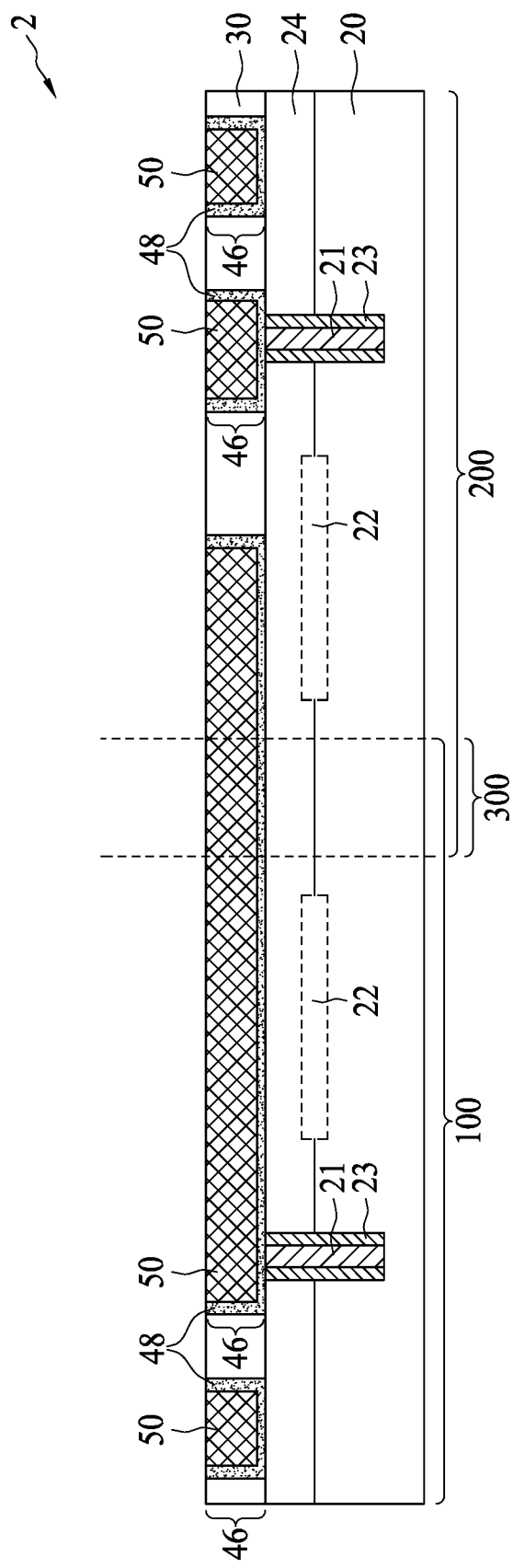

Referring to FIG. 5, conductive lines 46 are formed in IMD layer 30. The respective step is shown as step 412 in the process flow illustrated in FIG. 22. In accordance with some embodiments, metal lines 46 include diffusion barrier layers 48 and copper-containing material 50 over diffusion barrier layers 48. Diffusion barrier layers 48 may include titanium, titanium nitride, tantalum, tantalum nitride, or the like. Diffusion barrier layers 48 have the function of preventing copper in copper-containing material 50 from diffusing into IMD layer 30. Conductive lines 46 are referred to as metal lines 46 hereinafter. The formation of metal lines 46 may include forming a blanket diffusion barrier layer 48, depositing the copper-containing material 50 (for example, through plating), and then performing a planarization such as Chemical Mechanical Polish (CMP) to remove excess portions of barrier layer 48 and copper-containing material 50.

Figure 6:
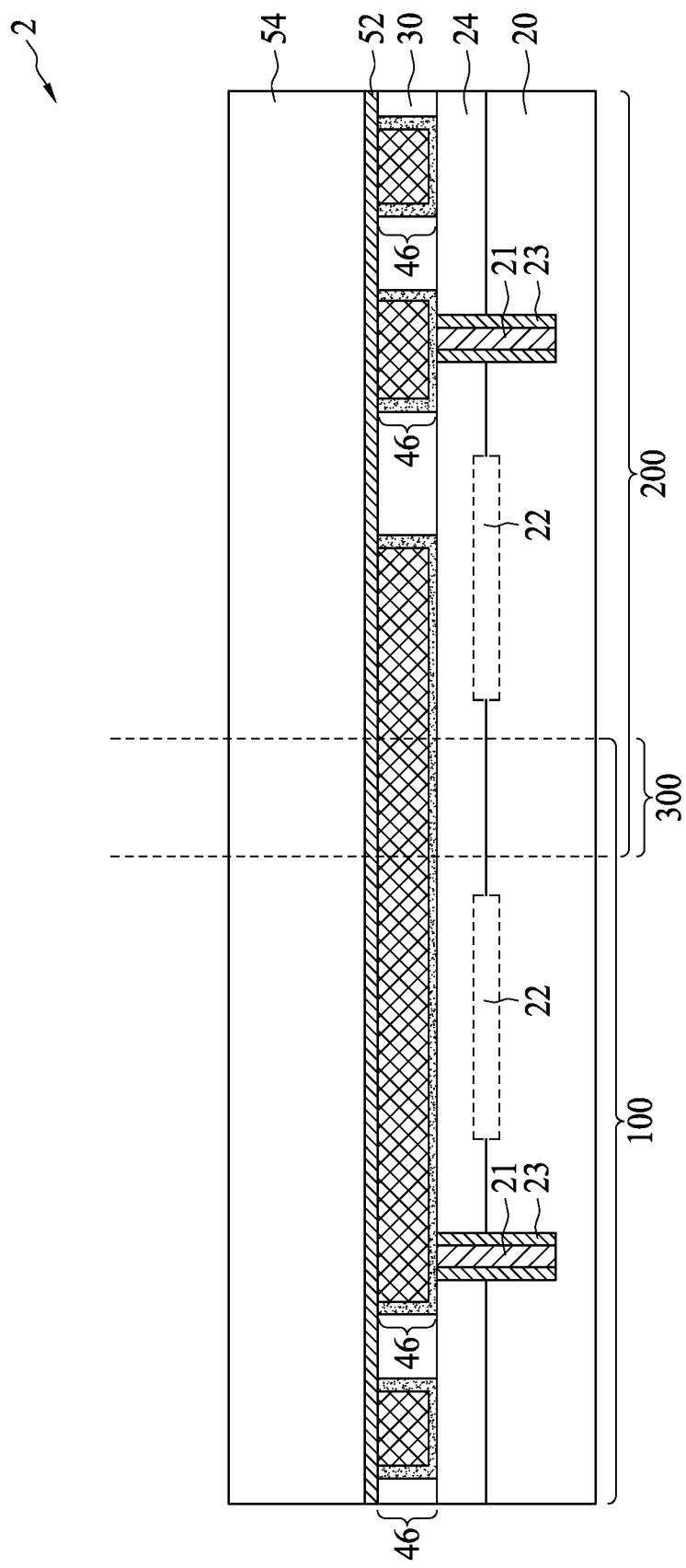

FIG. 6 illustrates the formation of Etch Stop Layer (ESL) 52 over IMD layer 30 and metal lines 46, and low-k dielectric layer 54 over ESL 52. ESL 52 may be formed of a nitride, a silicon-carbon based material, a carbon-doped oxide, and/or combinations thereof. The formation methods include Plasma Enhanced Chemical Vapor Deposition (PECVD) or other methods such as High-Density Plasma CVD (HDPCVD), Atomic Layer Deposition (ALD), and the like. In accordance with some embodiments, dielectric layer 52 is a diffusion barrier layer that is used for preventing undesirable elements, such as copper, from diffusing into the subsequently formed low-k dielectric layer. Dielectric layer 52 may also act as both an etch stop layer and a diffusion barrier layer.

FIG. 6 also illustrates the formation of dielectric layer 54, which may be a low-k dielectric layer or a non-low-k dielectric layer. Low-k dielectric layer 54 may have a k value lower than about 3.5, or lower than about 2.5. The materials comprised in low-k dielectric layer 54 may include a carbon-containing material, an organo-silicate glass, a porogen-containing material, and/or combinations thereof. Low-k dielectric layer 54 may be deposited using PECVD, while other commonly used deposition methods, such as LPCVD, ALD, and spin-on, can also be used.

Figure 22:
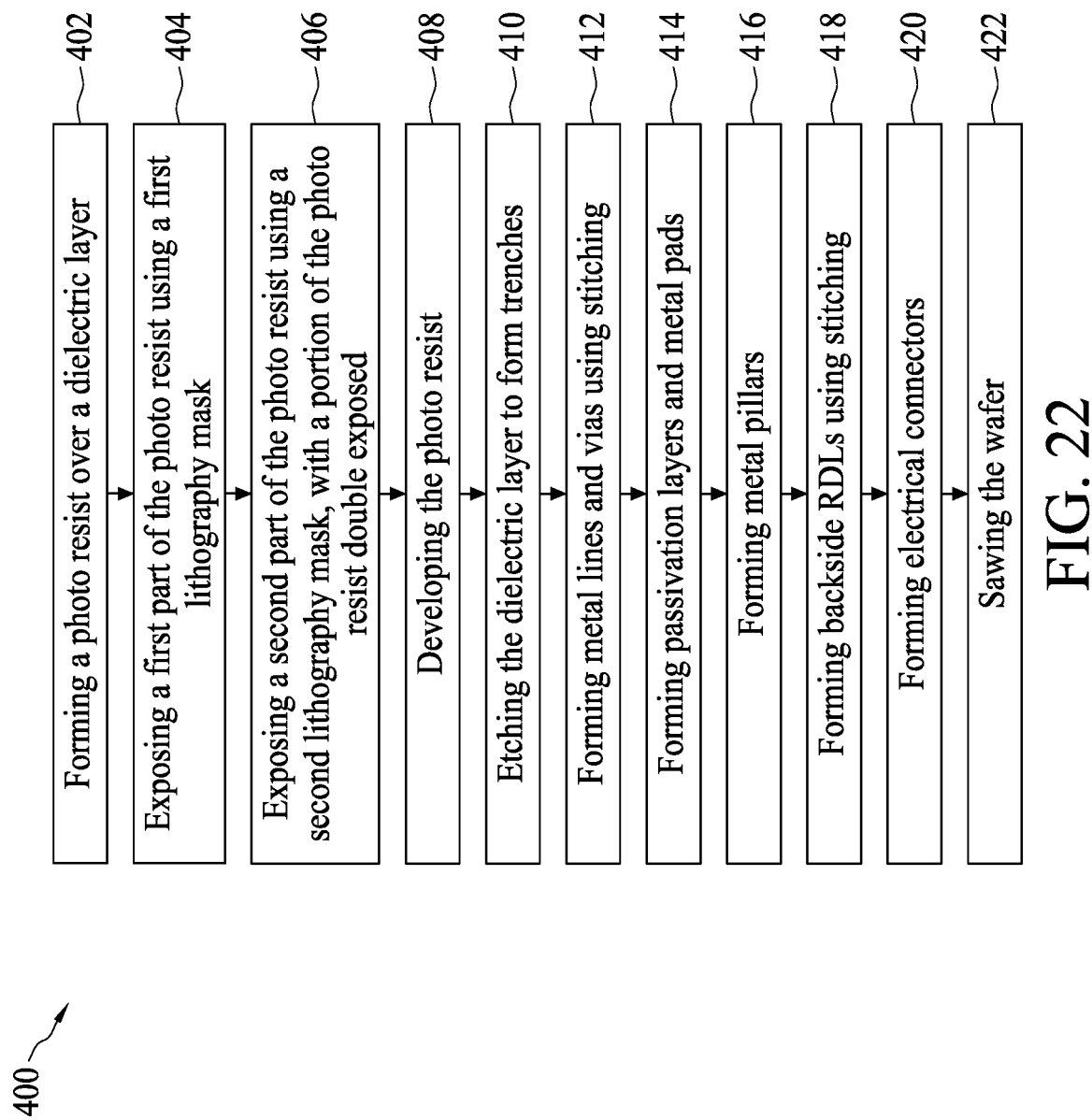
FIG. 22 illustrates a process flow for forming a large chip through stitching in accordance with some embodiments.

FIGS. 7 through 13 illustrate the formation of metal lines and vias using a dual damascene process, wherein the respective process steps may also be represented as steps 402 through 412 in the process flow shown in FIG. 22. FIGS. 7 through 11 illustrate the formation of via openings and trenches in accordance with some exemplary embodiments. It is appreciated that via-first approach is used as an example to show how via openings and trenches are formed, while other approaches such as via-last approach, metal hard mask approach, etc, may also be used, and the stitching concept in the present disclosure can also be applied to other approaches.

Figure 7:
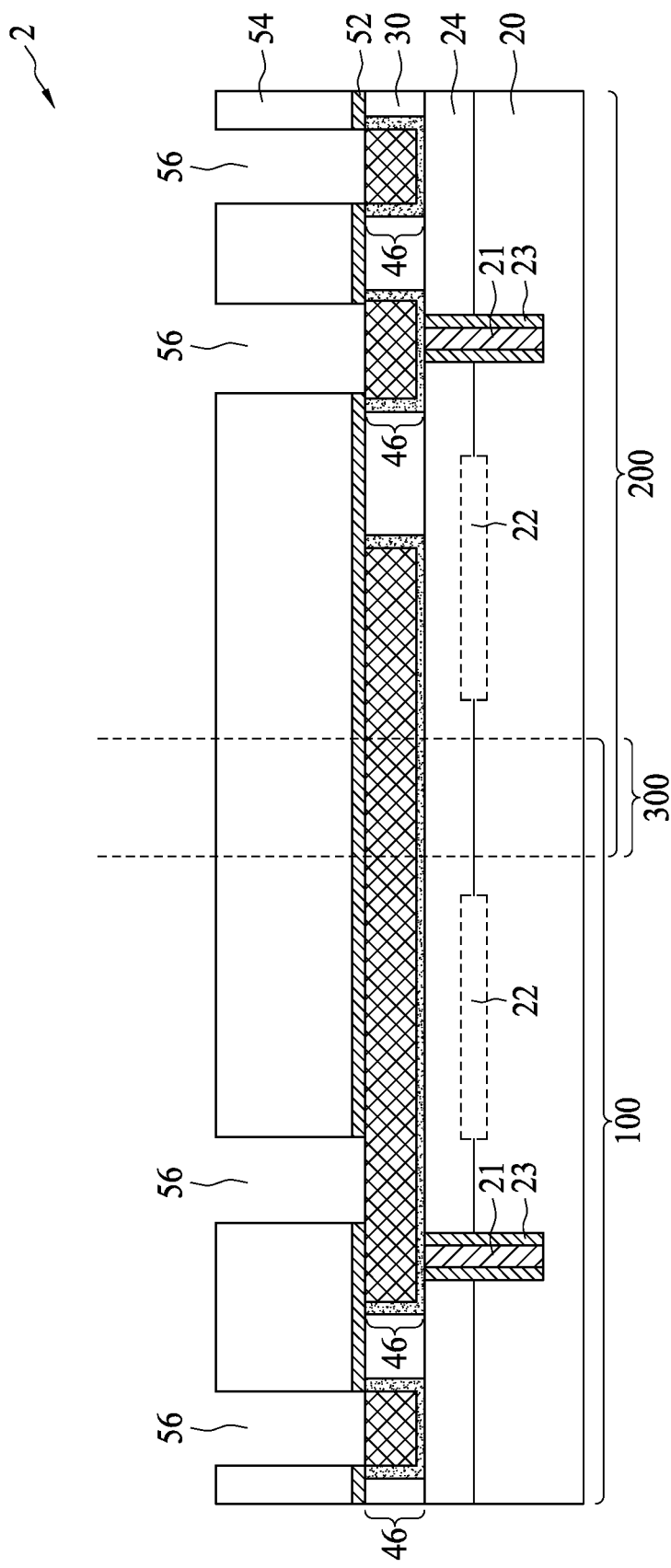

First, referring to FIG. 7, via openings 56 are formed. The formation may be achieved using the double exposure method as disclosed in FIGS. 2A through 4, wherein the details are not repeated herein. It is appreciated that via openings 56 may include the via openings used for forming vias used for electrical connection purpose, and the openings used for forming seal ring. The openings for electrical connection purpose are formed in the portions of regions 100 and 200 other than stitching zone 300. On the other hand, the via openings for forming the seal ring extend into stitching zone 300 (and other parts of regions 100 and 200) to ensure that the resulting seal ring extends into all low-k dielectric layers, and forms a seamless metal ring.

Figure 8A:
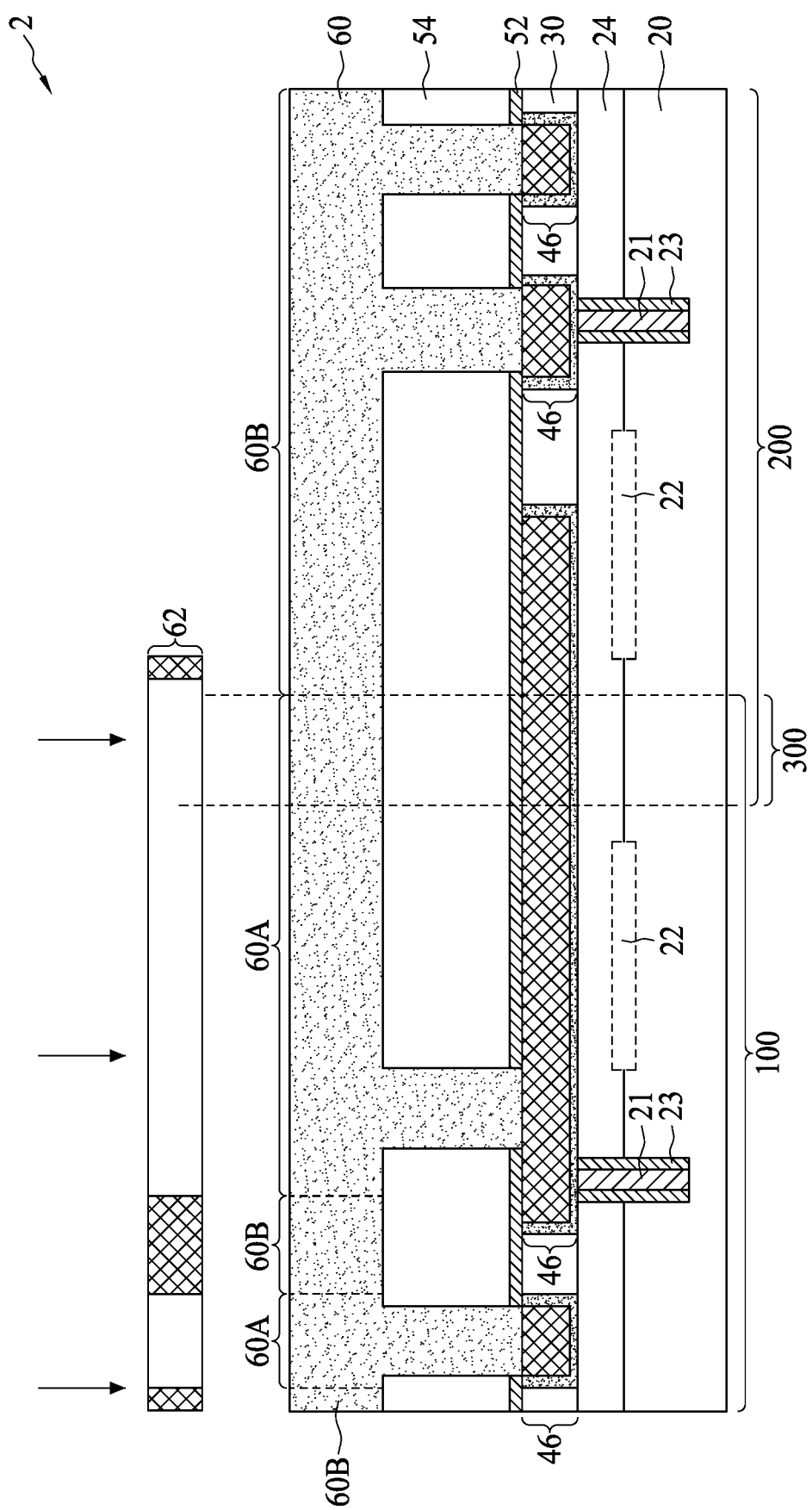

Next, referring to FIG. 8A, photo resist 60 is applied over IMD layer 54. Lithography mask 62 is then placed directly over region 100 (including stitching zone 300). Lithography mask 62 is used to expose the portions of photo resist 60 in regions 100 and 300, but not region 200. A light-exposure is then performed to expose portions 60A of photo resist 60, and portions 60B are not exposed.

Figure 8B:
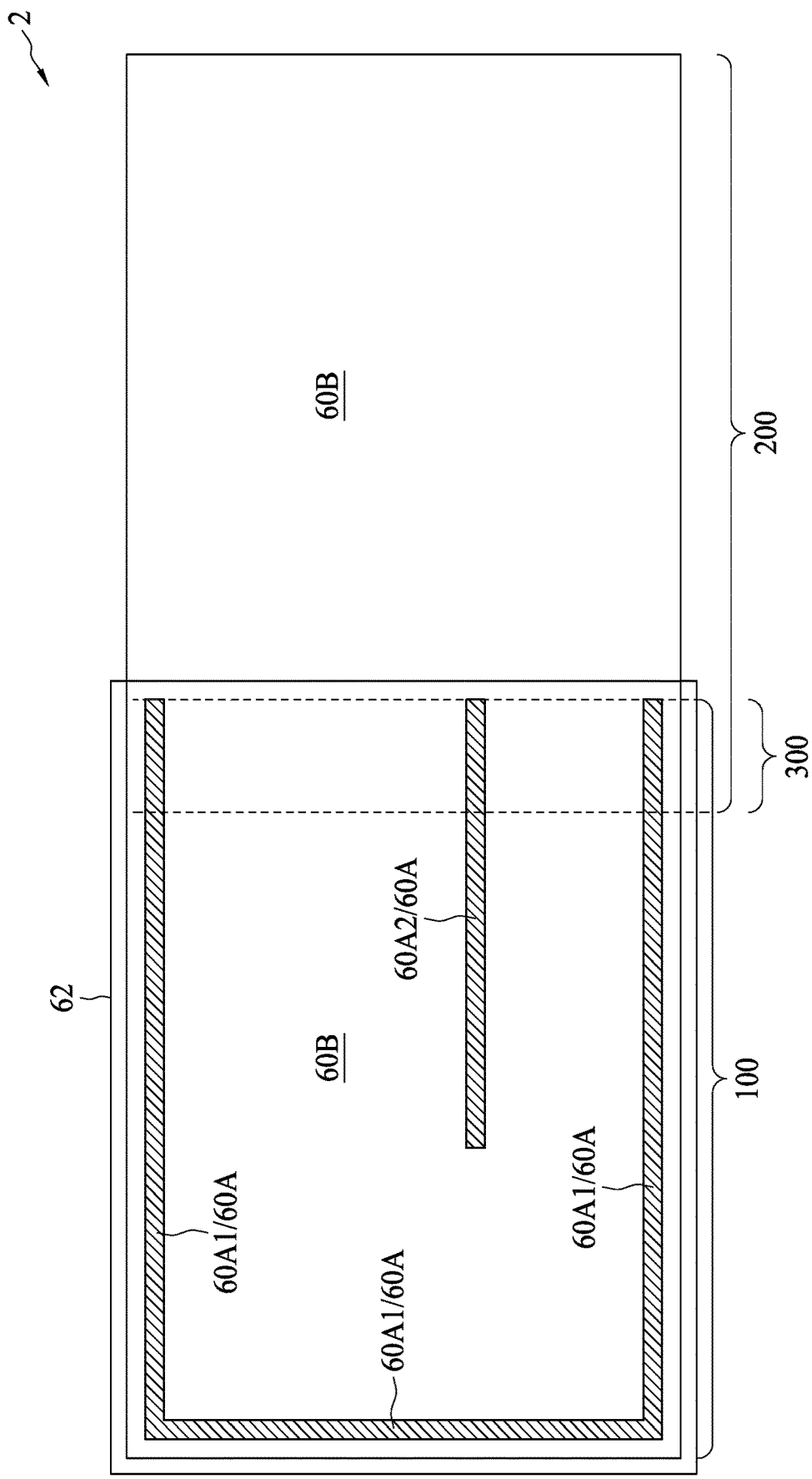

FIG. 8B illustrates a schematic top view of photo resist 60 after the light-exposure in FIG. 8A. The exposed portions 60A further include portions 60A1 and portions 60A2, wherein portions 60A1 define the patterns for forming seal ring 84 in FIG. 19. Portion 60A2 represents the portions that are used for forming metal lines in subsequent steps.

Figure 9A:
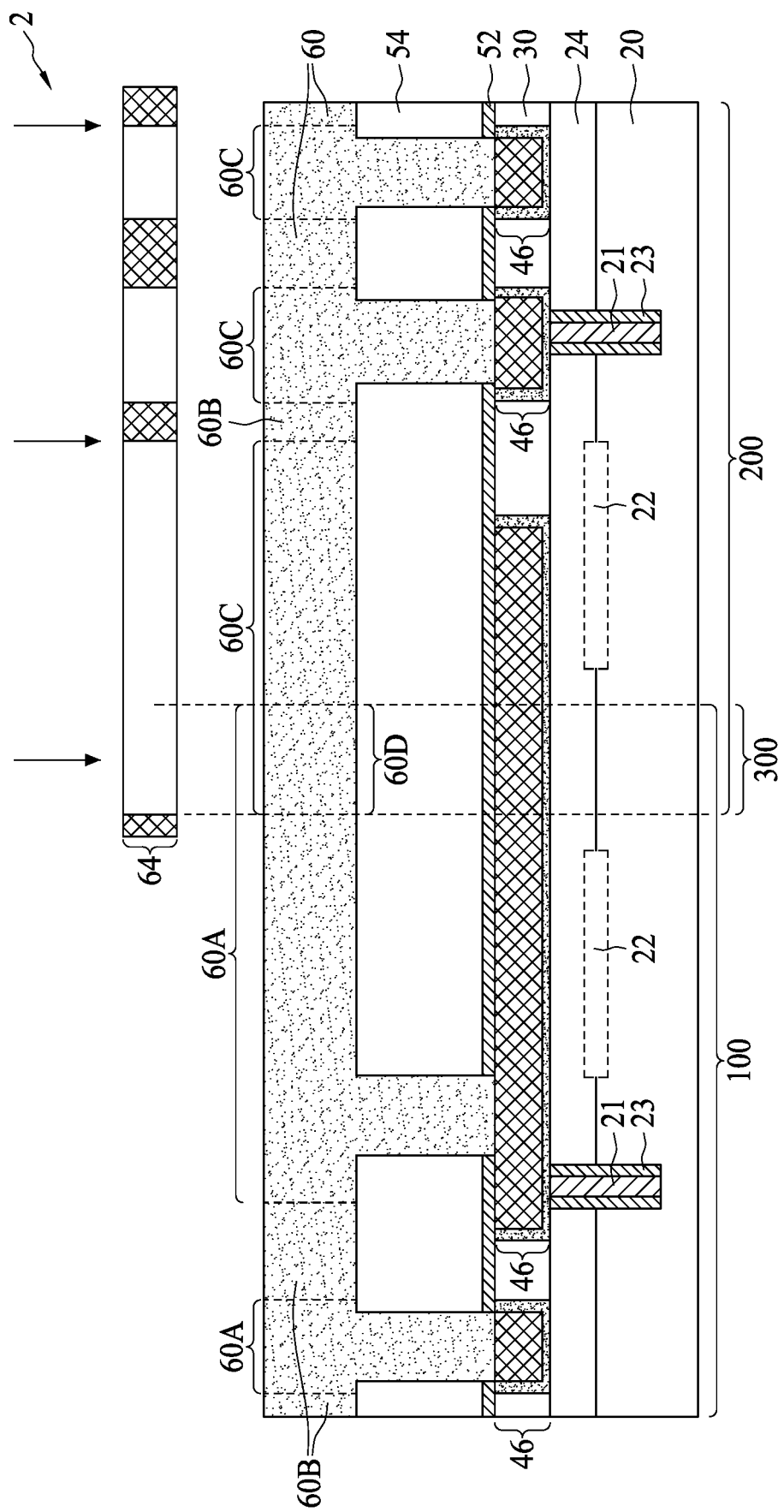

Referring to FIG. 9A, lithography mask 64 is placed directly over region 200 (including stitching zone 300). Lithography mask 64 is used to expose the portions of photo resist 60 in region 200 (including 300), but not region 100. A light-exposure is then performed to expose portions 60C of photo resist 60, and portions 60B are not exposed. Some of the exposed portions 60C overlap parts of the exposed portions 60A that have been exposed in the step shown in FIG. 8A. The overlap regions of portions 60A and 60C are referred to as double exposed portions 60D hereinafter. Double exposed portions 60D are in stitching zone 300.

Figure 9B:
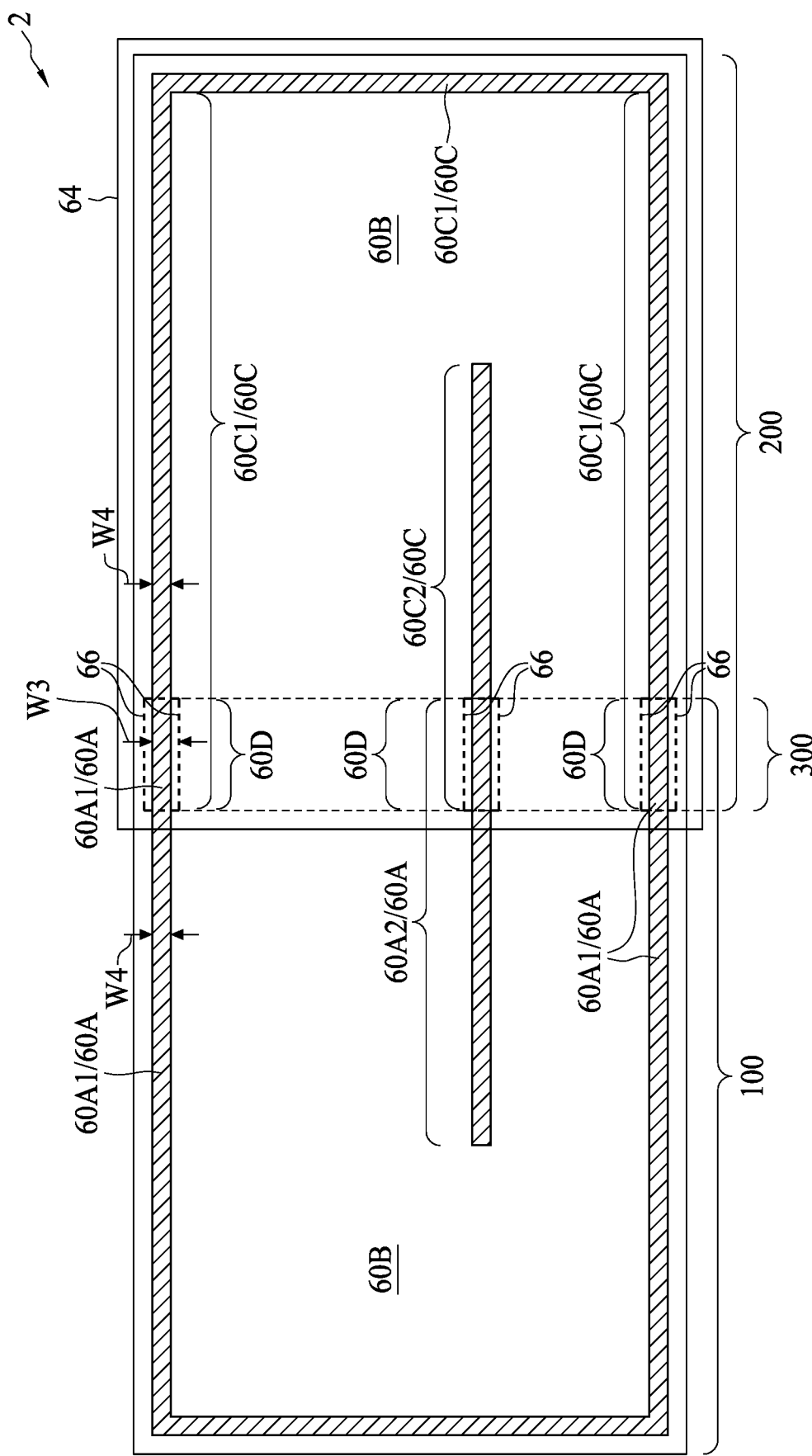

FIG. 9B illustrates a schematic top view of photo resist 60 after the light-exposure in FIG. 9A. The exposed portions 60C further include portions 60C1 and portions 60C2, wherein portions 60C1 define the patterns for forming seal ring 84 in FIG. 19. Portion 60C2 represents the portions that are used for forming metal lines in subsequent steps. Double exposed portions 60D also include portions 60D1, which are used for defining the patterns for forming the seal ring.

Again, double exposed portions 60D are light-exposed twice. Accordingly, the widths W3 of double exposed portions 60D may be greater than the width W4 of portions 60A and 60C. For example, dashed lines 66 schematically illustrate double exposed portions 60D may be wider than the portions exposed once. Similarly, if one or both lithography masks 62 (FIG. 8A) and 64 (FIG. 9A) are not aligned accurately, portions 60A2 and 60C2 may not be aligned to a straight line, and may be shifted or slanted, even if portions 60A2 and 60C2 are defined in the lithography masks as being a continuous straight strip having a uniform width. The joining portions of 60A1 and 60C1 may not be aligned to a straight line, and may be shifted or slanted.

Figure 10:
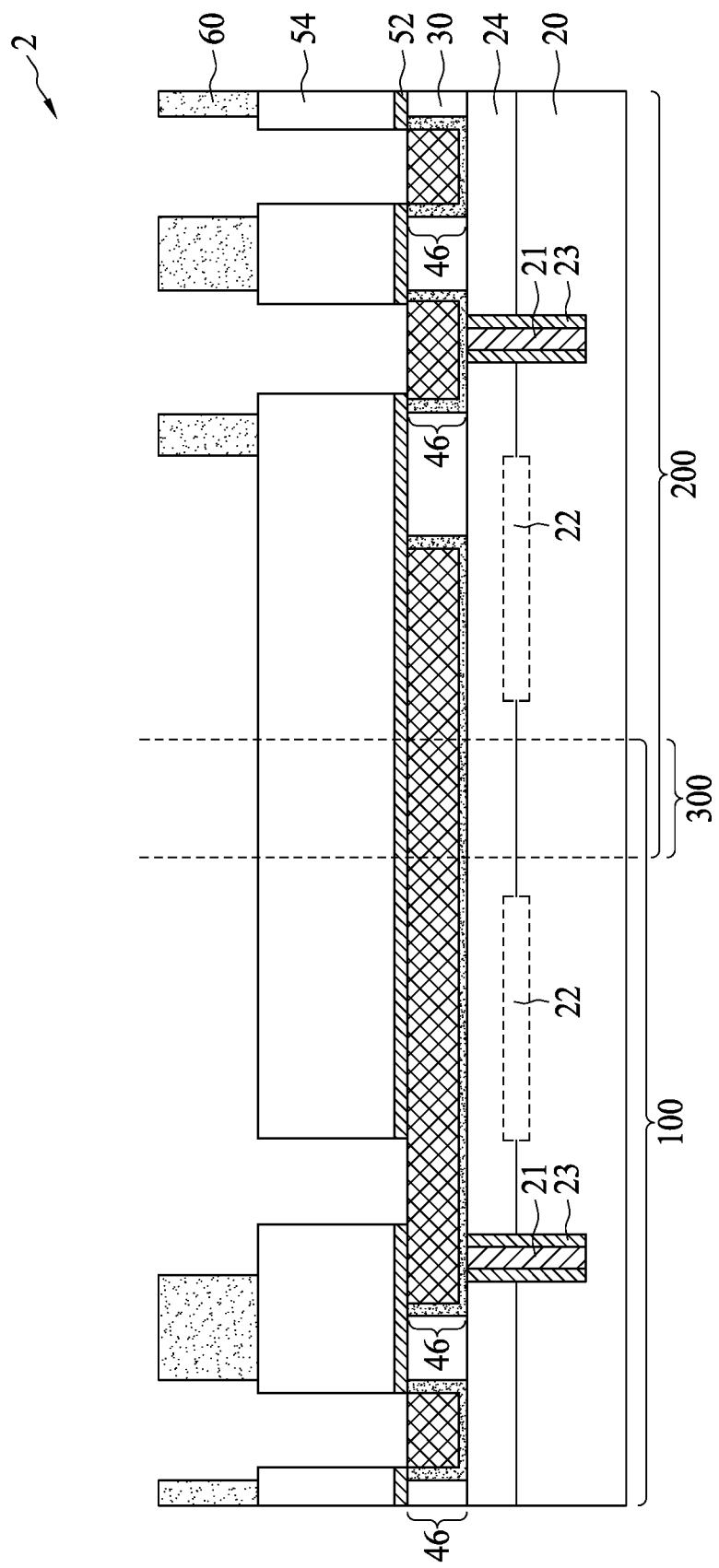
Figure 11:
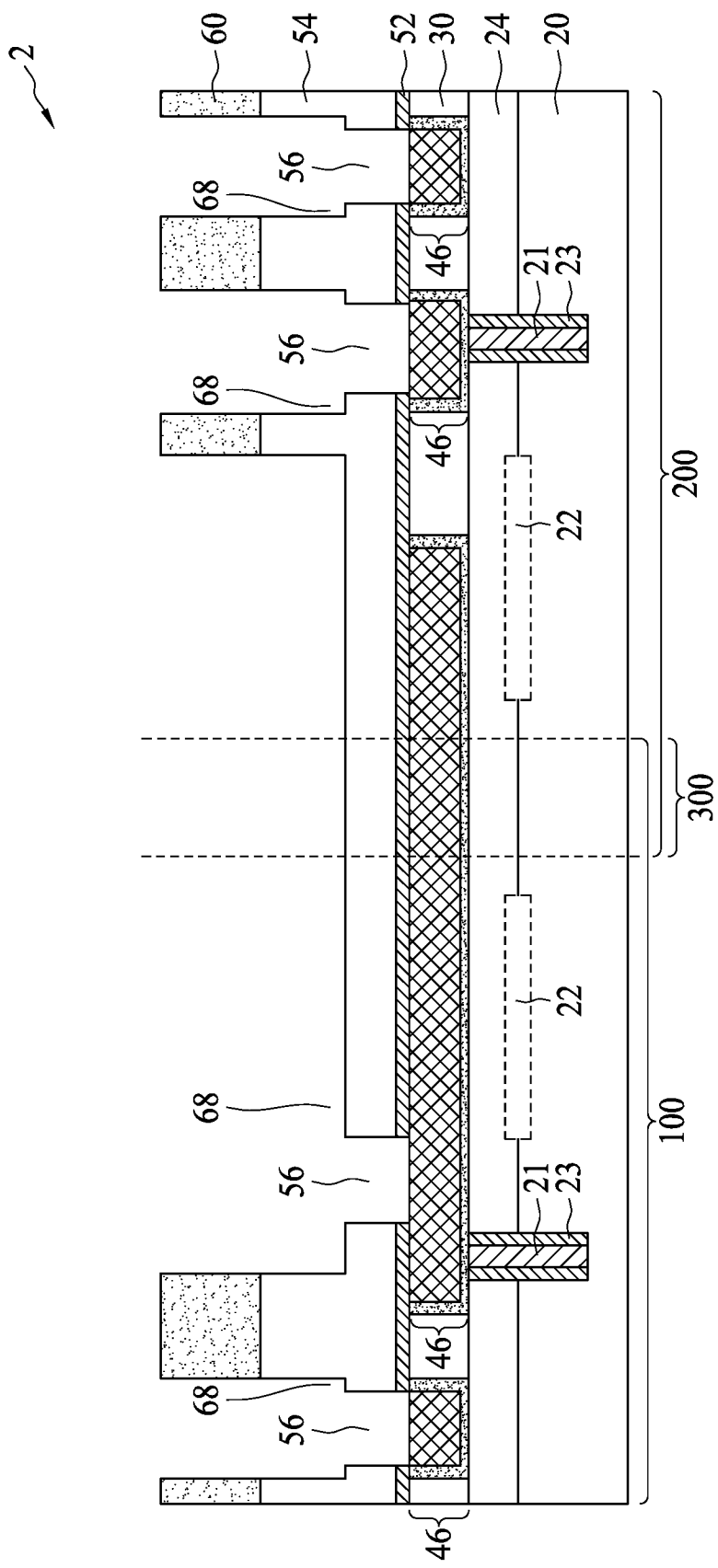
Figure 12:
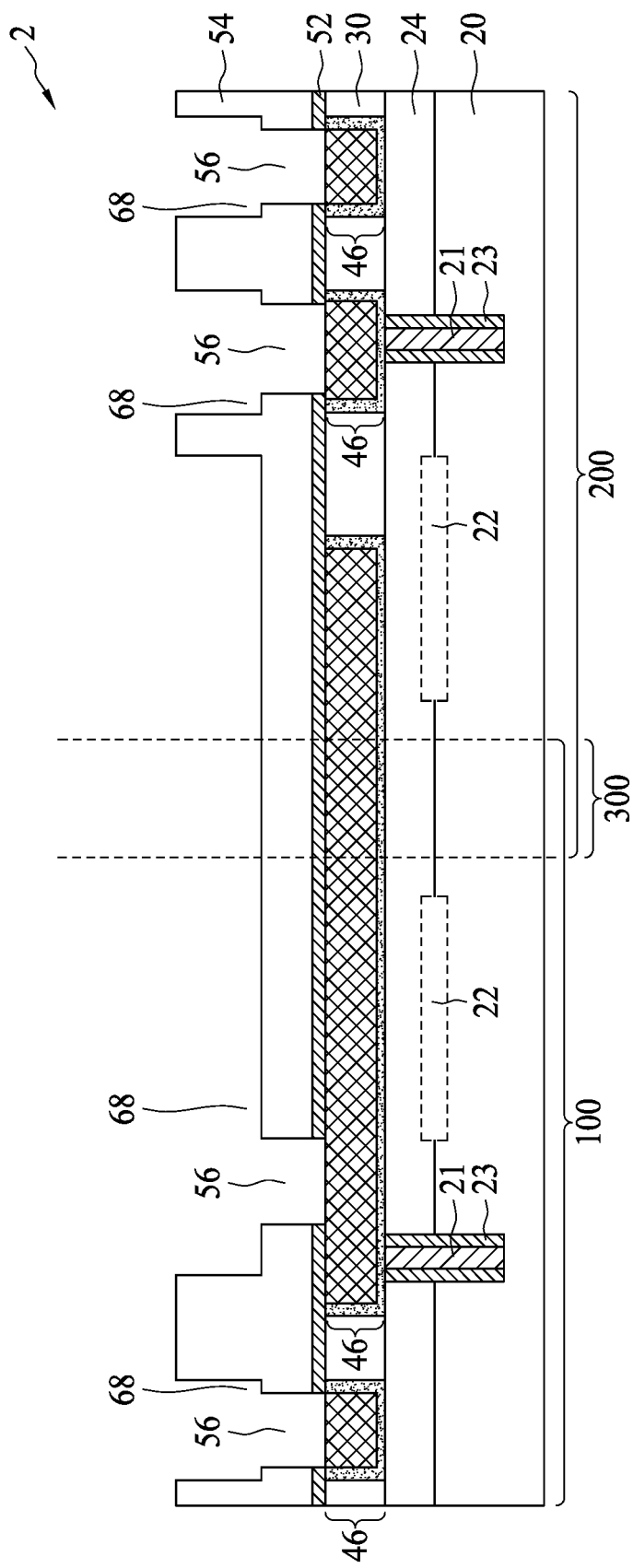

Next, a photo resist development is performed, and the exposed portions 60A and 60C, including the double exposed regions 60D, are removed, and unexposed portions 60B remain. The resulting structure is shown in FIG. 10. In a subsequent step as shown in FIG. 11, photo resist 60 is used as an etching mask to etch the underlying IMD layer 54, resulting in trenches 68 in IMD layer 54. Photo resist 60 is then removed, as shown in FIG. 12.

Figure 13:
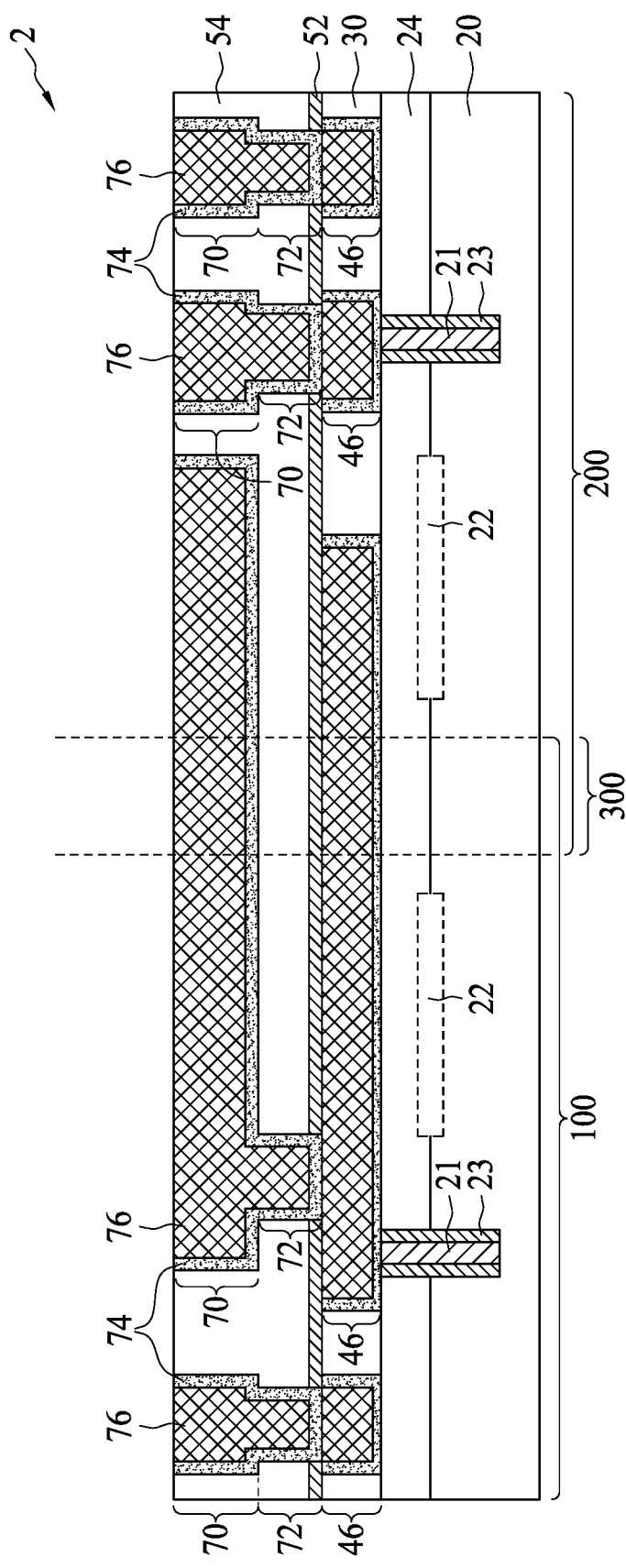

Referring to FIG. 13, conductive lines 70 and vias 72 are formed in IMD layer 54. In accordance with some embodiments, metal lines 70 and vias 72 include diffusion barrier layers 74 and copper-containing material 76 over diffusion barrier layers 74. Diffusion barrier layers 74 may include titanium, titanium nitride, tantalum, tantalum nitride, or the like. Conductive lines 70 are referred to as metal lines 70 hereinafter. The formation of metal lines 70 and vias 72 include forming a blanket diffusion barrier layer 74, forming the copper-containing material 76 (for example, through plating), and then performing a planarization such as CMP to remove excess portions of the barrier layer 74 and copper-containing material 76.

Figure 14:
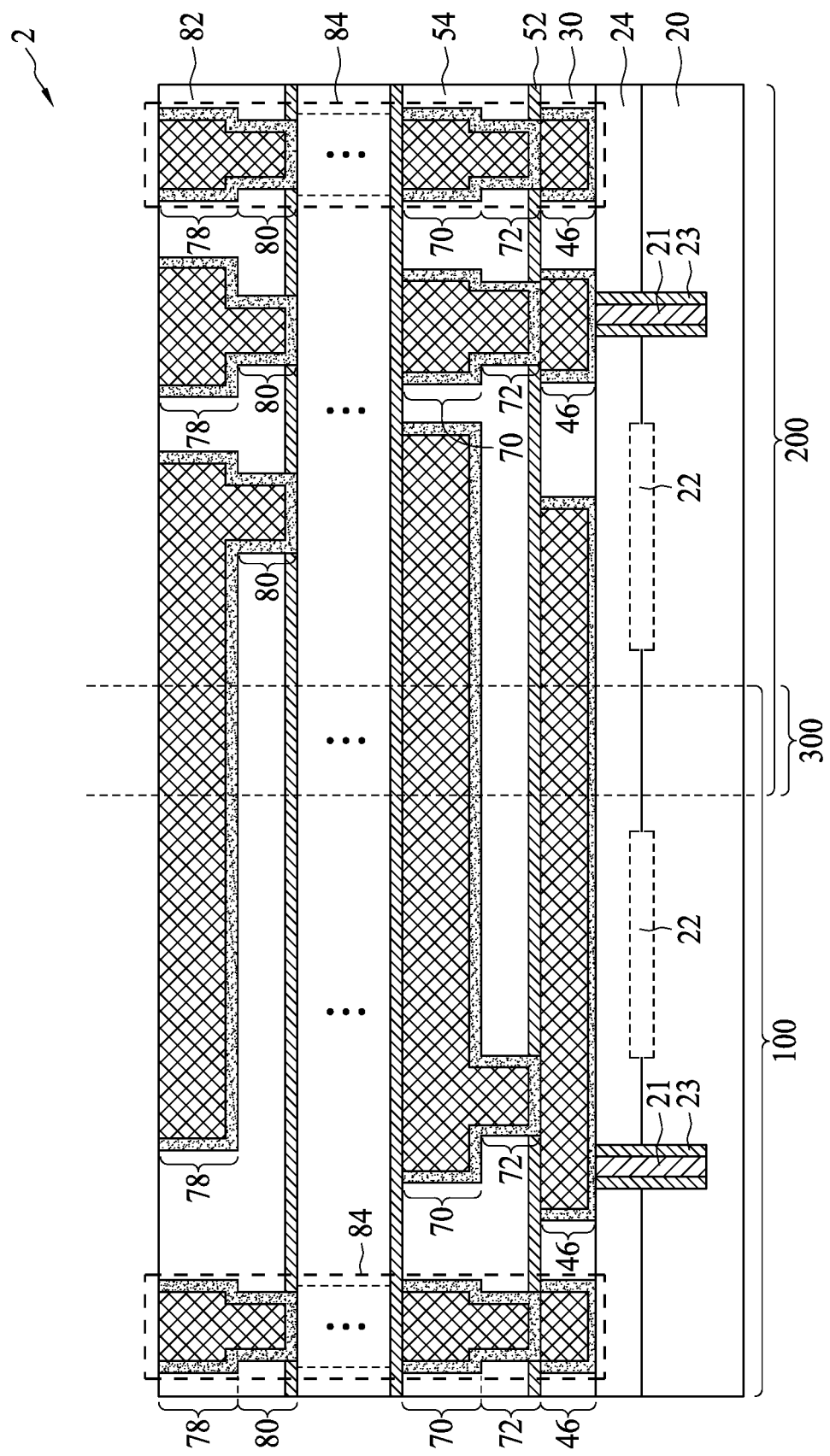

FIG. 14 illustrates the formation of additional IMD layers, metal lines, and vias over IMD layer 54. For example, a top metal layer and the respective underlying vias are illustrated. A top metal layer includes metal lines 78 and vias 80 formed in IMD layer 82. The formation processes and the materials of metal lines 78, vias 80, and IMD layer 82 are similar to the formation of metal lines 70, vias 72, and IMD layer 54, respectively, and are not repeated herein. There may be a plurality of metal layers between IMD layer 54 and IMD layer 82.

Seal ring 84 is formed of the metal lines and vias that extend throughout the dielectric layers including IMD layers 30 and 82, and all layers therebetween. Accordingly, seal ring 84 forms a full metal ring. Alternatively stated, seal ring 84 includes a portion in each of the metal line levels and the via levels, with each portion forming a full ring. Accordingly, seal ring 84 extends through all low-k dielectric layers, and may prevent moisture from penetrating into the portions of low-k dielectric layers encircled by seal ring 84.

Figure 15:
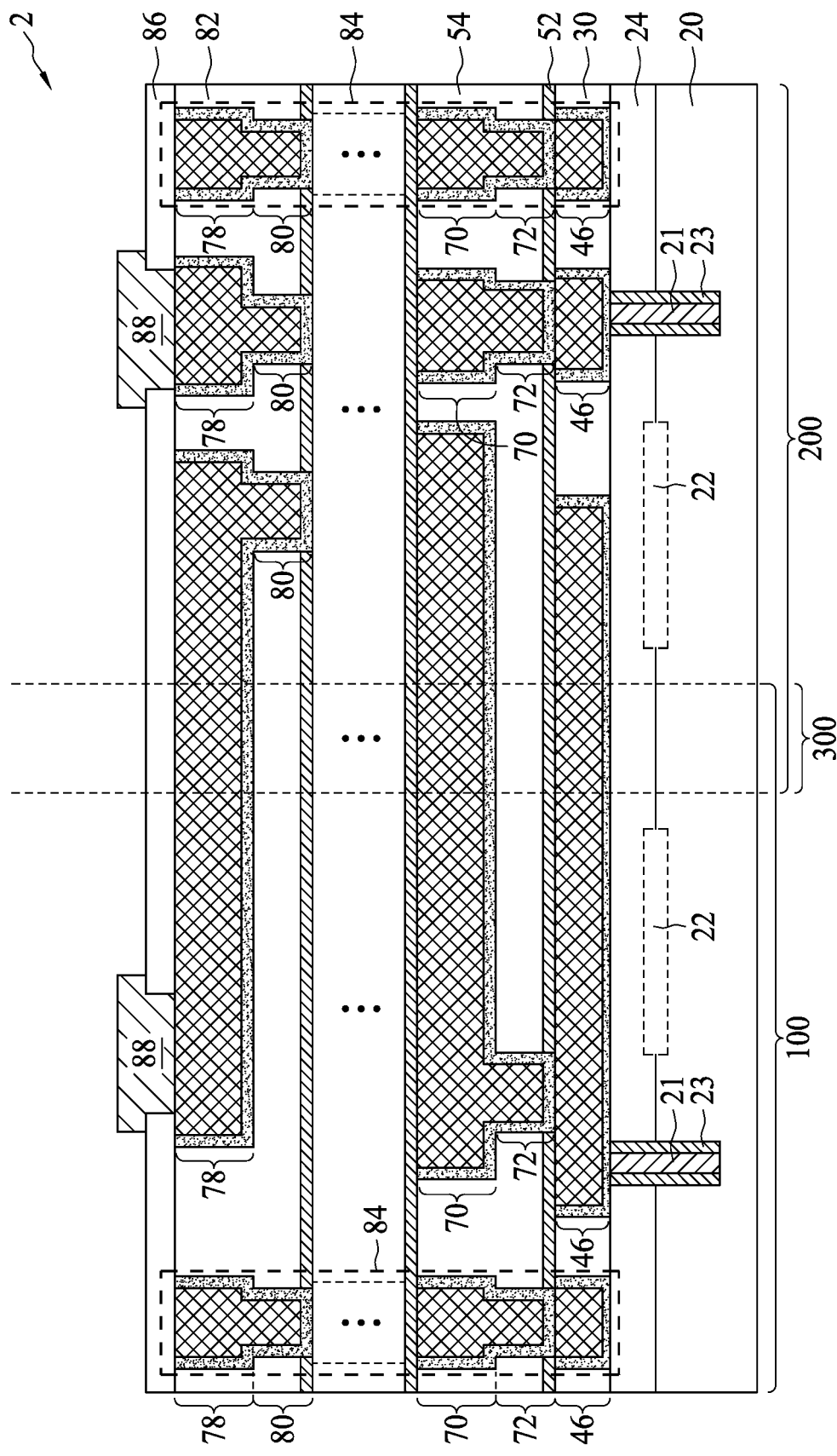

As shown in FIG. 15, passivation layer 86 is formed over interconnect structure 16. The respective step is shown as step 414 in the process flow illustrated in FIG. 22. Passivation layer 86 has a k value greater than 3.8, and is formed using a non-low-k dielectric material. In accordance with some embodiments of the present disclosure, passivation layer 86 is a composite layer including a silicon oxide layer (not shown), and a silicon nitride layer (not shown) over the silicon oxide layer. Passivation layer 86 may also be formed of other non-porous dielectric materials such as Un-doped Silicate Glass (USG), silicon oxynitride, and/or the like.

Passivation layer 86 is patterned, and metal pads 88 are formed to penetrate through passivation layer 86 in order to connect to metal lines 78. The respective step is also shown as step 414 in the process flow illustrated in FIG. 22. Metal pads 88 may be aluminum pads or aluminum-copper pads, and hence are alternatively referred to as aluminum pads 88 hereinafter, while other metallic materials may be used. For example, metal pads 88 may have an aluminum (atomic) percentage between about 99.5 percent and about 99.9 percent, and a copper percentage between about 0.1 percent and about 0.5 percent.

Figure 16:
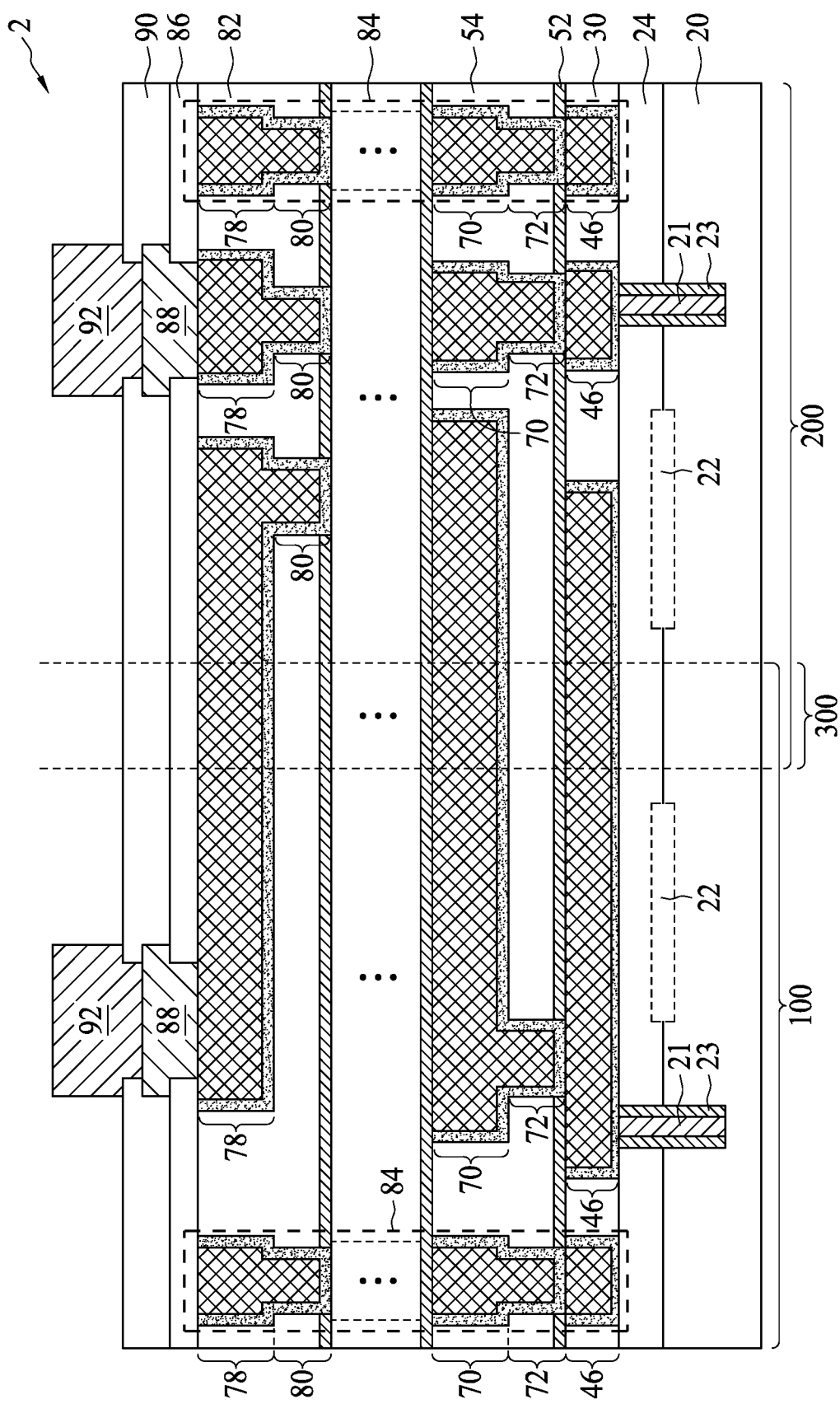

FIG. 16 illustrates the formation of passivation layer 90 and conductive pillars 92. The respective step is shown as step 416 in the process flow illustrated in FIG. 22. Passivation layer 90 may be formed of similar materials as passivation layer 86. Some portions of passivation layer 90 cover the edge portions of metal pads 88, and the central portions of metal pads 88 are exposed through the openings in passivation layer 86. Conductive pillars 92 are formed to extend into the openings in passivation layer 86, and are electrically connected to metal pads 88.

Figure 17:
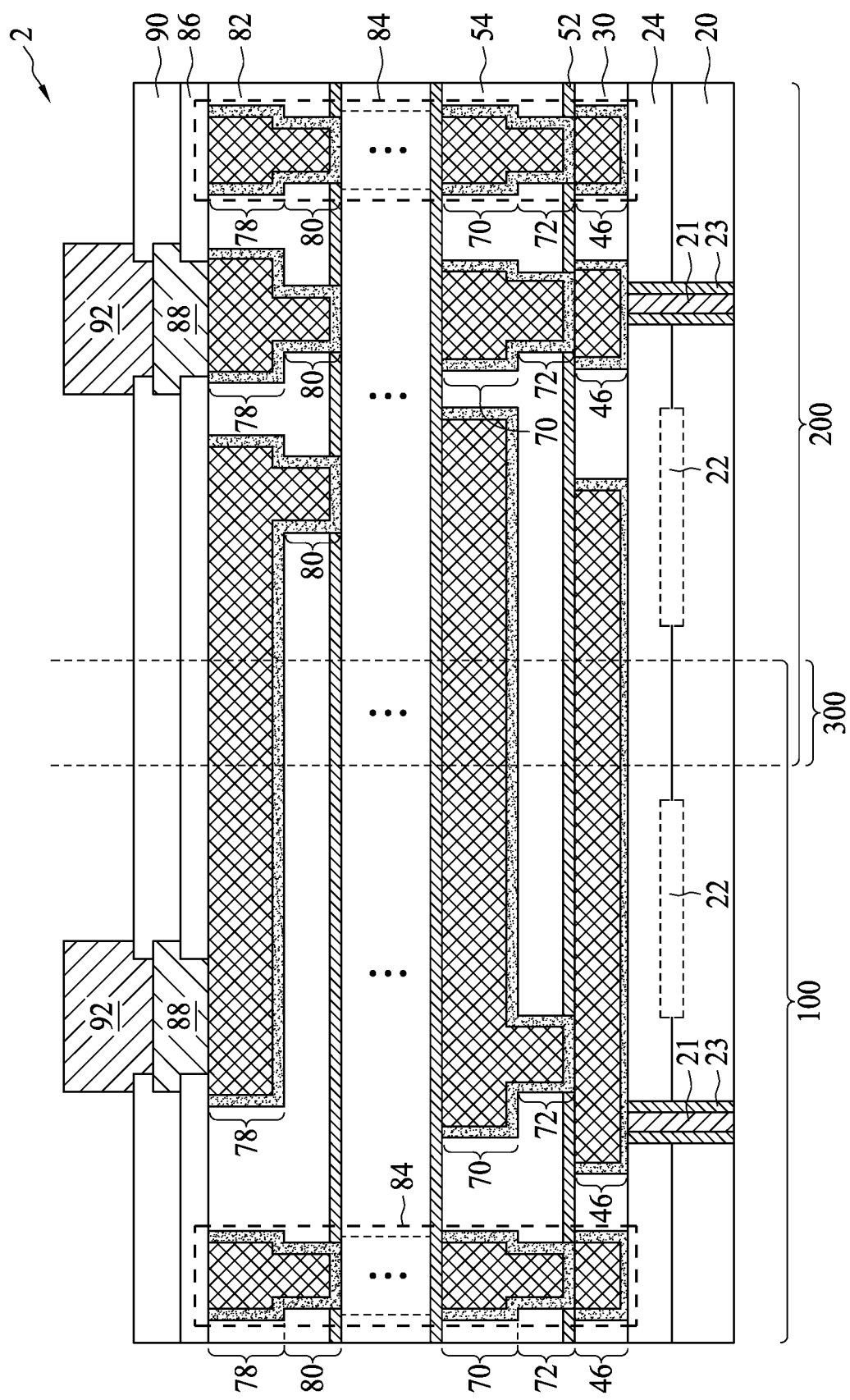
Figure 18:
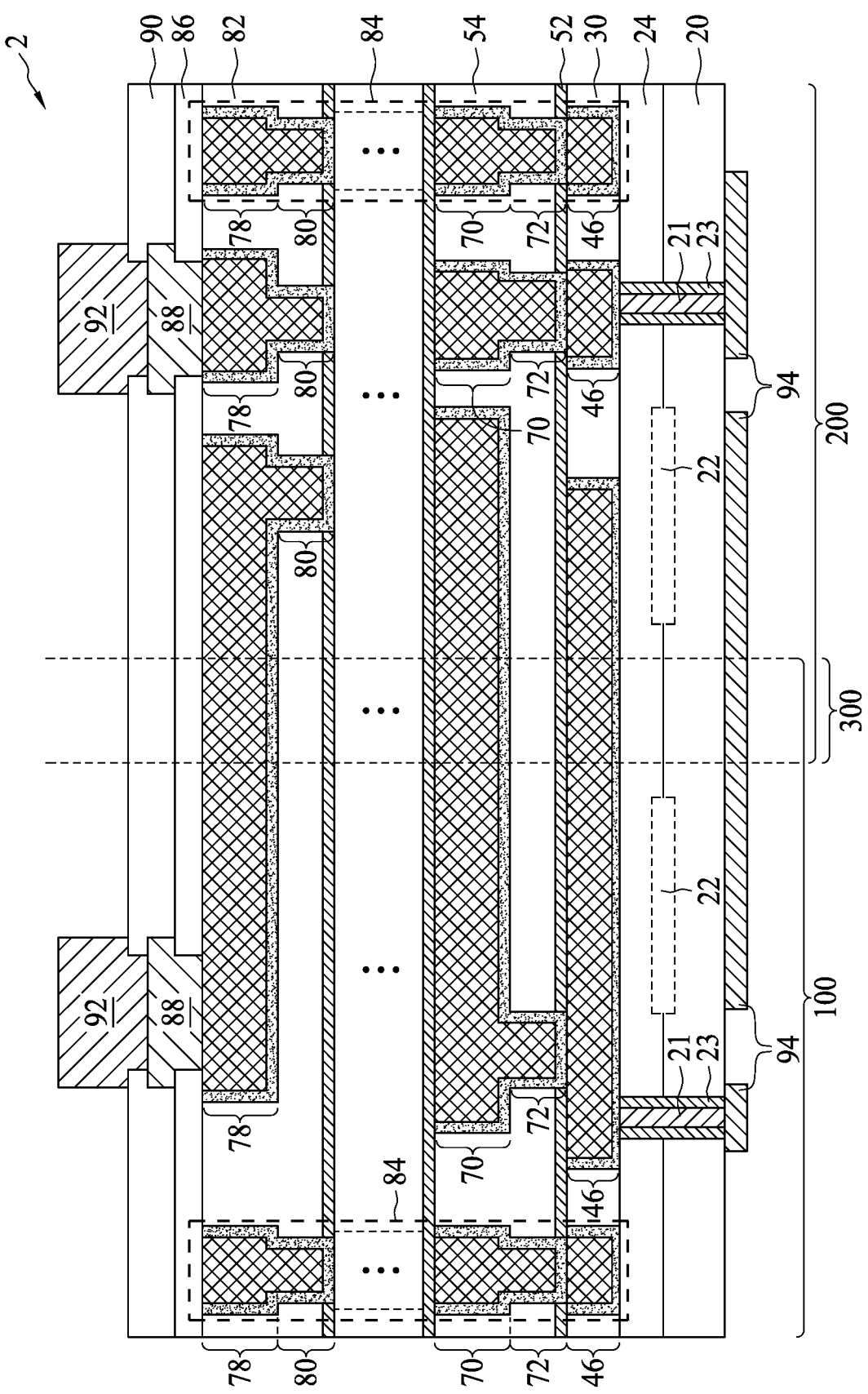

FIGS. 17 through 19 illustrate the backside process performed on the backside of wafer 2. Referring to FIG. 17, a backside grinding is performed on wafer 2 to expose through-vias 21, wherein the portion of substrate 20 below the bottom surfaces of through-vias 21 are removed by grinding. Next, as shown in FIG. 18, Redistribution lines (RDLs) 94 are formed, wherein RDLs 94 may be formed of copper, aluminum, nickel, or the like. RDLs 94 are electrically coupled to through-vias 21 and the overlying metal lines 46. The formation of RDLs 94 may also adopt the stitching technology as disclosed in FIGS. 2A through 4. The respective step is shown as step 418 in the process flow illustrated in FIG. 22. In accordance with some embodiments, the formation of RDLs 94 include forming a blanket seed layer (such as a titanium layer and a copper layer on the titanium layer), forming a patterned photo resist (not shown), and plating RDLs 94 in the openings in the patterned photo resist. The photo resist may be exposed using double exposure, so that RDLs 94 may extend from region 100 into region 200.

FIG. 19 illustrates the formation of electrical connectors 98, which may be solder regions, metal pads, metal pillars, or the like. The respective step is shown as step 420 in the process flow illustrated in FIG. 22. The respective step is shown as step 422 in the process flow illustrated in FIG. 22. In accordance with some embodiments, a Chip-on-Wafer-on-Substrate (CoWoS) process is performed. In an exemplary CoWoS process, a plurality of identical device dies (not shown) are bonded to metal pillars 92 in wafer 2, with each of the device dies bonded to one of chips 4. Wafer 2 is then sawed apart into a plurality of chips 4, wherein the sawing is performed on scribe lines 6, with each of the chips 4 having a device die (not shown) bonded thereon. The resulting singulated chips 4 may them be bonded to packages substrates (not shown) to form the CoWoS packages.

Figure 20:
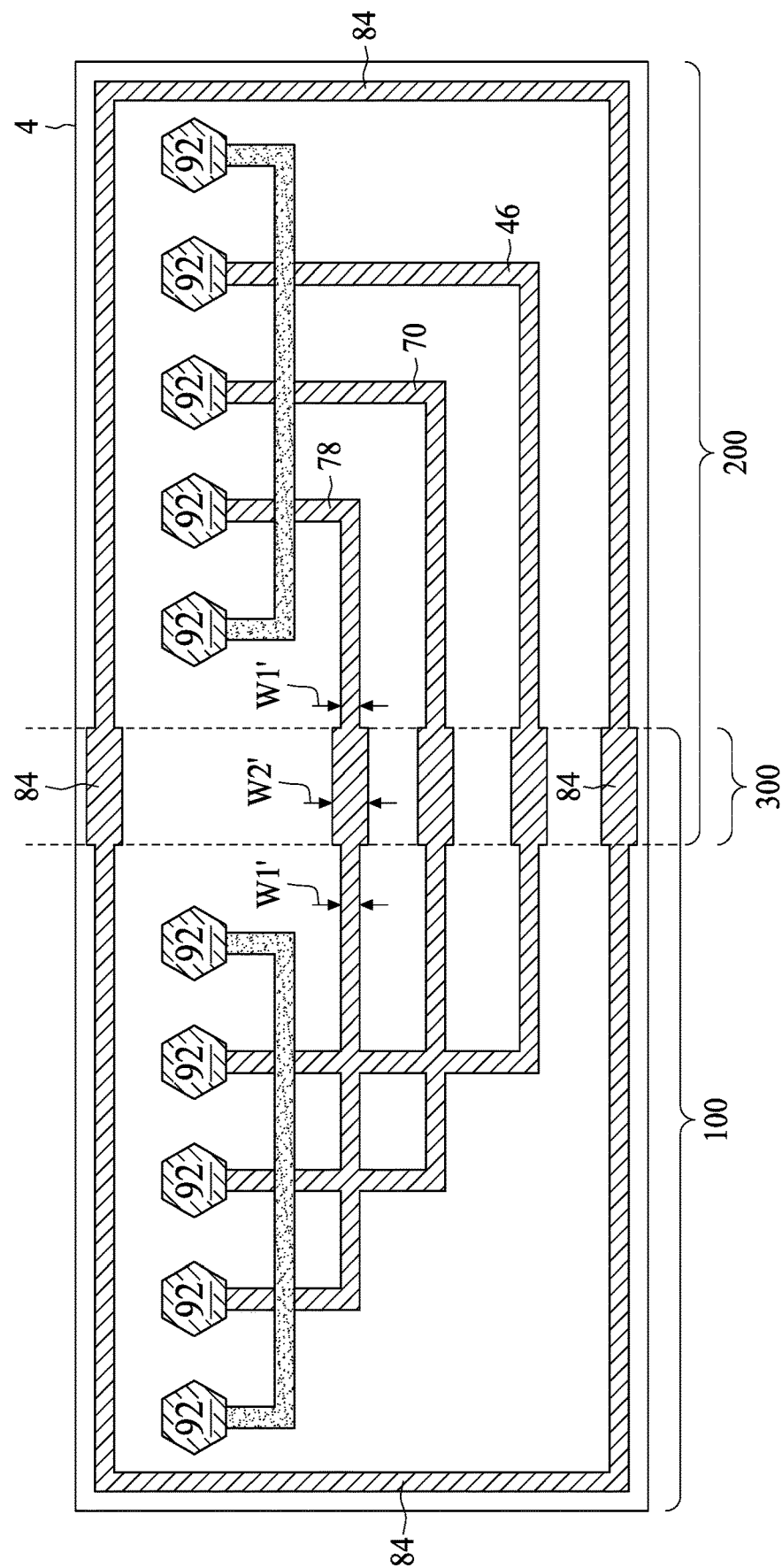
FIGS. 20 and 21 illustrate large chips formed through stitching in accordance with some embodiments.
Figure 21:
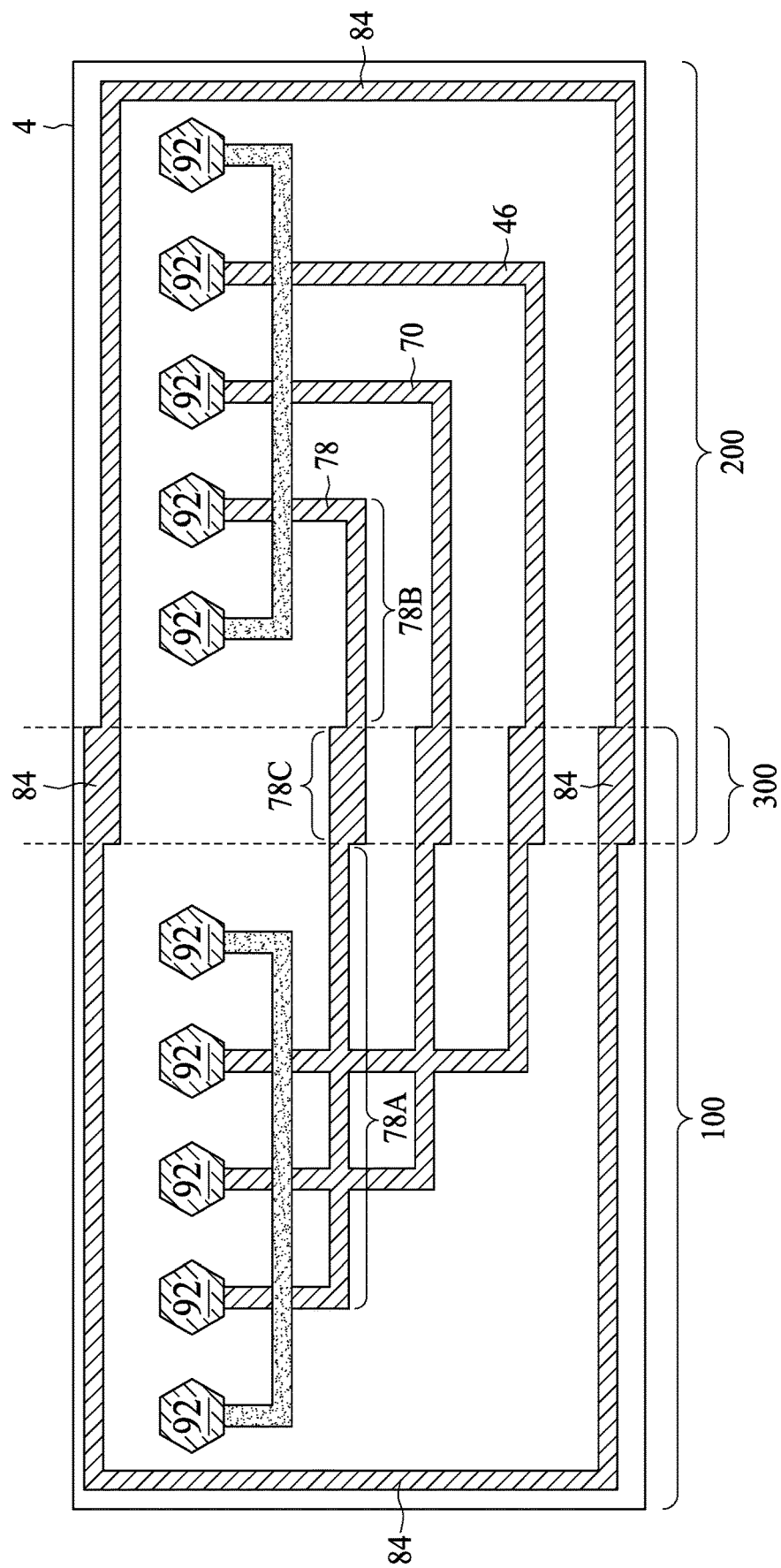

FIGS. 20 and 21 schematically illustrate the top views of some features in chip 4 in accordance with some exemplary embodiments. Seal ring 84 forms a full ring proximal the edges of the resulting chip 4. Chip 4 has an area larger than the area of an exemplary reticle field, which may be 26 mm×33 mm in accordance with some exemplary embodiments. Accordingly, the resulting chip 4 may have an area up to 52 mm×33 mm when using the reticle field of 26 mm×33 mm. Seal ring 84 includes portions in stitching zone 300 and additional portions in remaining regions 100 and 200 that do not overlap the stitching zone. Metal lines 46, 70, and 78 also extend into region 300 and further into regions 100 and 200. Accordingly, metal lines 46, 70, and 78 and RDLs 94 (FIG. 18) are used to interconnect the metal features formed using different lithography masks.

FIG. 20 illustrates the widening of the metal features in stitching zone 300. In accordance with some embodiments, the width W2' of the portions of metal lines (such as metal line 78) in stitching zone 300 is greater than the widths W1' of the portions of the same metal lines in regions 100 and 200 due to the double exposure. The difference (W2-W1) may be greater than about 400 nm, and may be in the range between about 400 nm and about 12,000 nm in accordance with some exemplary embodiments. Seal ring 84 also has the same behavior.

FIG. 21 illustrates the misalignment of the features formed using two lithography masks. For example, metal line 78 may include portion 78A in region 100, portion 78B in region 200 not overlapping stitching zone 300, and portion 78C in stitching zone 300. Portions 78A and 78B are not aligned to the same straight line. Furthermore, portion 78C is wider than portions 78A and 78B. Seal ring 84 may have the same behavior if the misalignment occurs.

Figure 23:
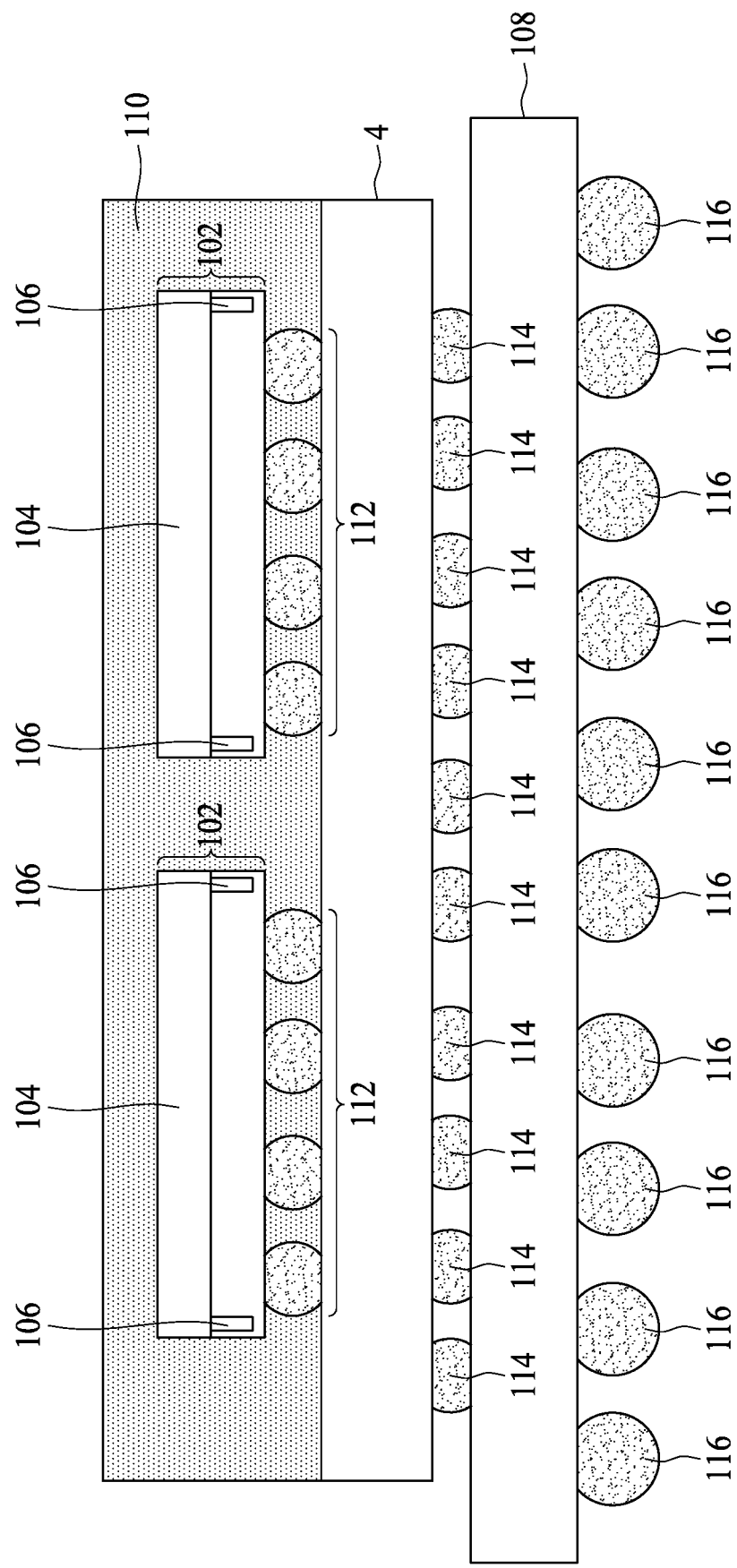
FIG. 23 illustrates a cross sectional view of a Chip-on-Wafer-on-Substrate (CoWoS) structure in accordance with some embodiments.

FIG. 23 illustrates a cross sectional view of a Chip-on-Wafer-on-Substrate (CoWoS) structure in accordance with some embodiments, which includes dies 102 bonded to die 4 through flip-chip bonding. Dies 102 may be device dies including active devices (such as transistors and/or diodes). Die 4 may be an interposer with no active devices therein. Device dies 102 include semiconductor substrates 104 and seal rings 106. In accordance with some embodiments, die 4 is formed using the stitching method, and hence includes stitching zones 300 as shown in FIG. 20 or 21. Device dies 102 are not formed using stitching. Accordingly, each of the four sides of seal rings 106 may have a uniform width, and no stitching zone is observed. Device dies 102 may be encapsulated in encapsulating material 110, which may be a molding compound or a molding underfill. Interposer 4 is further formed on package substrate 108, which may be a laminate substrate or a built-up substrate. Solder regions 112, 114, and 116 are used for bonding.

The embodiments of the present disclosure have some advantageous features. Through stitching, the conductive features defined by two lithography masks are stitched together, and hence the resulting chip may be greater than the maximum size defined by the reticle field.

In accordance with some embodiments of the present disclosure, a method includes performing a first light-exposure and a second a second light-exposure on a photo resist. The first light-exposure is performed using a first lithograph mask, which covers a first portion of the photo resist. The first portion of the photo resist has a first strip portion exposed in the first light-exposure. The second light-exposure is performed using a second lithograph mask, which covers a second portion of the photo resist. The second portion of the photo resist has a second strip portion exposed in the second light-exposure. The first strip portion and the second strip portion have an overlapping portion that is double exposed. The method further includes developing the photo resist to remove the first strip portion and the second strip portion, etching a dielectric layer underlying the photo resist to form a trench, and filling the trench with a conductive feature.

In accordance with some embodiments of the present disclosure, a method includes forming a dielectric layer having a first region, a second region, and a third region between and joining the first region and the second region, forming a photo resist over the dielectric layer, with the photo resist including a first portion, a second portion, and a third portion overlapping the first region, the second region, and the third region, respectively, of the dielectric layer. A first light-exposure is performed on the first portion and the third portion of the photo resist, with the second portion of the photo resist not exposed. A second light-exposure is performed on the second portion and the third portion of the photo resist, with the first portion of the photo resist not exposed. The photo resist is developed to form a patterned photo resist. The dielectric layer is etched using the patterned photo resist as an etching mask, and a trench is formed to continuously extend into the first region, the second region, and the third region of the dielectric layer. The trench is filled with a conductive material.

In accordance with some embodiments of the present disclosure, an integrated circuit structure includes a die, which further includes a substrate, a conductive feature over the substrate and at a surface of the die, and a conductive line electrically coupled to the conductive feature. The conductive line includes a first portion in a first region, with the conductive feature being in the first region, a second portion in a second region, and a third portion in a third region. The third region is between the first region and the second region. The third portion has a width greater than widths of the first portion and the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first dielectric layer over a substrate, wherein the first dielectric layer extends into a first device region and a second device region;
   forming a photo resist comprising:
      a first part in the first device region; and
      a second part in the second device region;
   forming a first metal line in the first dielectric layer, wherein the first metal line is in the first device region, and wherein the forming the first metal line comprises a first process, and the first process comprises a first light-exposure process using a first lithograph mask to expose the first part of the photo resist;
   forming a second metal line in the first dielectric layer, wherein the second metal line is in the second device region, wherein the forming the second metal line comprises a second process separate from the first process, and wherein the second process comprises a second light-exposure process using a second lithograph mask to expose the second part of the photo resist; and
   forming a seal ring comprising a first portion in the first dielectric layer, wherein the first portion of the seal ring encircles both of the first metal line and the second metal line.

2. The method of claim 1, wherein both of the first dielectric layer and the photo resist extends into a third device region between the first device region and the second device region, and wherein a third portion of the photo resist in the third device region is exposed during both of the first light-exposure process and the second light-exposure process.

3. The method of claim 1, wherein the first lithograph mask and the second lithograph mask have different patterns.

4. The method of claim 1, wherein an entirety of the first dielectric layer is deposited in a same deposition process.

5. The method of claim 1 further comprising:
   when the first metal line is formed, simultaneously forming an additional first part of the first portion of the seal ring in the first dielectric layer; and
   when the second metal line is formed, simultaneously forming an additional second part of the first portion of the seal ring in the first dielectric layer.

6. The method of claim 1 further comprising forming a second dielectric layer over the substrate, wherein a second portion of the seal ring extends into the second dielectric layer.

7. The method of claim 1 further comprising performing a die-saw process to form a package, with the seal ring formed in a peripheral region of the package.

8. The method of claim 7, wherein the seal ring comprises four sides, and the die-saw process is performed proximal the four sides of the seal ring.

9. A method comprising:
   forming a dielectric layer over a substrate;
   performing a first light-exposure process on a first portion of a photo resist;
   performing a second light-exposure process on a second portion of the photo resist;
   developing the photo resist to remove the first portion and the second portion of the photo resist, wherein a trench ring is formed in the photo resist;

etching the dielectric layer using the photo resist as an etching mask to extend the trench ring into the dielectric layer; and filling the trench ring with a conductive material to form a seal ring.

10. The method of claim 9, wherein the trench ring is a full ring.

11. The method of claim 9, wherein the first light-exposure process is performed using a first lithography mask, and the second light-exposure process is performed using a second lithography mask different from the first lithography mask.

12. The method of claim 11, wherein the first lithography mask and the second lithography mask have different patterns.

13. The method of claim 11, wherein during the first light-exposure process, the first lithography mask covers the first portion of the photo resist without covering the second portion of the photo resist, and during the second light-exposure process, the second lithography mask covers the second portion of the photo resist without covering the first portion of the photo resist.

14. The method of claim 9 further comprising forming a first metal line, wherein a first pattern of the first metal line is defined in the first light-exposure process.

15. The method of claim 14 further comprising forming a second metal line, wherein a second pattern of the second metal line is defined in the second light-exposure process.

16. A method comprising:
forming a wafer comprising:
  forming a dielectric layer over a semiconductor substrate;
  forming a seal ring in the dielectric layer, wherein the seal ring comprises:
    a first portion having a first width;
    a second portion having a second width; and
    a third portion joining the first portion to the second portion, wherein the third portion has a third width greater than the first width and the second width; and
sawing the wafer to form a package comprising the seal ring therein, wherein an edge of the package is parallel to the first portion, the second portion, and the third portion of the seal ring.

17. The method of claim 16, wherein the forming the seal ring comprises:
forming a photo resist over the dielectric layer;
performing a first light-exposure process on the photo resist to define a first pattern of the first portion of the seal ring;
performing a second light-exposure process on the photo resist to define a second pattern of the second portion of the seal ring;
developing the photo resist to form a patterned photo resist;
etching the dielectric layer to form a trench, wherein the etching is performed using the patterned photo resist as an etching mask; and
filling the trench with a conductive material to form a conductive feature.

18. The method of claim 17, wherein a pattern of the third portion of the seal ring is defined by both of the first light-exposure process and the second light-exposure process.

19. The method of claim 16, wherein the wafer is an interposer wafer.

20. The method of claim 1, wherein the seal ring encircles parts of both of the first device region and the second device region.

* * * * *